(12) United States Patent
Kim

(10) Patent No.: US 11,380,390 B2
(45) Date of Patent: Jul. 5, 2022

(54) MEMORY DEVICE, AND ELECTRONIC DEVICE INCLUDING THE SAME

(71) Applicant: Samsung Electronics Co., Ltd., Suwon-si (KR)

(72) Inventor: Garam Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/984,801

(22) Filed: Aug. 4, 2020

(65) Prior Publication Data

US 2021/0201992 A1    Jul. 1, 2021

(30) Foreign Application Priority Data

Dec. 26, 2019  (KR) .................. 10-2019-0175039

(51) Int. Cl.
  *G11C 11/56*       (2006.01)
  *G11C 16/04*       (2006.01)
  (Continued)

(52) U.S. Cl.
  CPC .......... *G11C 11/5642* (2013.01); *G06N 3/04* (2013.01); *G11C 11/5628* (2013.01); *G11C 11/5671* (2013.01); *G11C 16/0483* (2013.01); *G11C 16/08* (2013.01); *G11C 16/10* (2013.01); *G11C 16/24* (2013.01); *G11C 16/26* (2013.01);
  (Continued)

(58) Field of Classification Search
  CPC .......... G11C 11/5642; G11C 11/5628; G11C 11/5671; G11C 16/0483; G11C 16/08; G11C 16/10; G11C 16/24; G11C 16/26; G11C 2211/5642; G11C 7/1006; G11C 11/54; G11C 2211/5641; G11C 5/147; G11C 7/06; G11C 7/18; G11C 8/14; G06N 3/04; H01L 24/08; H01L 25/0657; H01L 25/18; H01L 2224/08145; H01L 2924/1431; H01L 2924/14511; G06F 3/0656; G06F 12/0882
  See application file for complete search history.

(56) References Cited

U.S. PATENT DOCUMENTS 5,630,024 A      5/1997  Aihara et al.
7,593,263 B2 *   9/2009  Sokolov ................. G11C 16/26
                                                       365/185.03

(Continued)

FOREIGN PATENT DOCUMENTS

KR         1020090098101 A     9/2009

*Primary Examiner* — Tri M Hoang
(74) *Attorney, Agent, or Firm* — Muir Patent Law, PLLC

(57) ABSTRACT

A memory device includes a memory cell array including M memory cells connected to one bit line and configured to distributively store N-bit data, where N is a natural number of 2 or more and M is a natural number of 2 or more and less than or equal to N, the M memory cells including a first memory cell and a second memory cell having different sensing margins, and a memory controller including a page buffer, the memory controller configured to distributively store the N-bit data in the M memory cells and to sequentially read data stored in the M memory cells to obtain the N-bit data, and an operation logic configured to execute an operation using the N-bit data, the memory controller configured to provide different reading voltages to the first memory cell and the second memory cell.

17 Claims, 26 Drawing Sheets

(51) Int. Cl.
*G11C 16/08* (2006.01)
*G11C 16/10* (2006.01)
*G11C 16/24* (2006.01)
*G11C 16/26* (2006.01)
*H01L 25/065* (2006.01)
*H01L 25/18* (2006.01)
*H01L 23/00* (2006.01)
*G06N 3/04* (2006.01)

(52) U.S. Cl.
CPC .......... *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(56) References Cited

U.S. PATENT DOCUMENTS

| | | | |
|---|---|---|---|
| 7,643,340 B2 | 1/2010 | Kong et al. | |
| 9,099,185 B2 * | 8/2015 | Kim | G11C 11/56 |
| 9,489,263 B2 * | 11/2016 | Hyun | G11C 16/349 |
| 9,589,647 B1 * | 3/2017 | Ahn | G11C 11/5671 |
| 9,904,478 B2 * | 2/2018 | Roh | G11C 16/10 |
| 9,947,394 B2 * | 4/2018 | Yoon | G11C 16/08 |
| 9,972,399 B2 * | 5/2018 | Seo | G11C 16/0483 |
| 10,275,172 B2 * | 4/2019 | Pahwa | G11C 29/028 |
| 10,332,594 B2 | 6/2019 | Miyashita et al. | |
| 10,431,298 B2 | 10/2019 | Hara et al. | |
| 10,748,621 B2 * | 8/2020 | Kwak | G11C 16/3459 |
| 10,877,697 B2 * | 12/2020 | Ji | G11C 16/10 |
| 2018/0211154 A1 | 7/2018 | Mori et al. | |
| 2020/0257500 A1 | 8/2020 | Kim | |

* cited by examiner $$\underset{81}{\downarrow}$$

| $X_0$ | $X_1$ | $X_2$ | $X_3$ | $X_4$ | $X_5$ |
|---|---|---|---|---|---|
| $X_6$ | $X_7$ | $X_8$ | $X_9$ | $X_{10}$ | $X_{11}$ |
| $X_{12}$ | $X_{13}$ | $X_{14}$ | $X_{15}$ | $X_{16}$ | $X_{17}$ |
| $X_{18}$ | $X_{19}$ | $X_{20}$ | $X_{21}$ | $X_{22}$ | $X_{23}$ |

$\otimes$ $$\underset{82}{\downarrow}$$

| $W_0$ | $W_1$ |
|---|---|
| $W_2$ | $W_3$ |

$=$ $$\underset{83}{\downarrow}$$

| $S_0$ | $S_1$ | $S_2$ | $S_3$ | $S_4$ |
|---|---|---|---|---|
| $S_6$ | $S_7$ | $S_8$ | $S_9$ | $S_{10}$ |
| $S_{12}$ | $S_{13}$ | $S_{14}$ | $S_{15}$ | $S_{16}$ |

FIG. 3

$S_0$ = [ $X_0 W_0$ | $X_1 W_1$ ; $X_6 W_2$ | $X_7 W_3$ ] = $W_0 \cdot X_0 + W_1 \cdot X_1 + W_2 \cdot X_6 + W_3 \cdot X_7$

FIG. 4

MEMORY DEVICE, AND ELECTRONIC DEVICE INCLUDING THE SAME

CROSS-REFERENCE TO RELATED APPLICATION(S)

This application claims priority under 35 USC 119(a) to Korean Patent Application No. 10-2019-0175039 filed on Dec. 26, 2019 in the Korean Intellectual Property Office, the entire disclosure of which is incorporated herein by reference for all purposes.

BACKGROUND

The present inventive concept relates to a memory device and an electronic device including the same.

Memory devices may provide a function for writing and erasing data or reading recorded data. A memory device includes a plurality of memory cells, and generally, the magnitude of data that may be written to each of the memory cells has a fixed value. In a memory device applied to a recently proposed neuromorphic system, an autonomous driving device, or the like, an operation logic capable of performing a predetermined operation may be mounted inside the memory device.

SUMMARY

An aspect of the present inventive concept is to provide a memory device capable of improving the calculation speed of an operation logic by distributively storing data used for a neural network calculation processed by the operation logic included inside the memory device in two or more memory cells depending on the number of bits.

According to an example embodiment, a memory device includes a memory cell array including M memory cells connected to one bit line and configured to distributively store N-bit data, where N is a natural number of 2 or more and M is a natural number of 2 or more and less than or equal to N, the M memory cells including a first memory cell and a second memory cell having different sensing margins, and a memory controller including a page buffer, the memory controller configured to distributively store the N-bit data in the M memory cells and to sequentially read data stored in the M memory cells to obtain the N-bit data, and an operation logic configured to execute an operation using the N-bit data, the memory controller configured to provide different reading voltages to the first memory cell and the second memory cell.

According to an example embodiment, a memory device includes a memory cell array including a plurality of memory cells connected to a plurality of bit lines and a plurality of word lines, and a memory controller configured to select M memory cells continuously connected to one bit line, among the plurality of memory cells, where M is a natural number of 2 or more, and to divide N-bit data into M sets of bits, and to store the M sets of bits in the M memory cells, respectively, where N is a natural number more than or equal to M. The M memory cells include a first memory cell and a second memory cell. The memory controller stores at least one upper bit of the N-bit data in the first memory cell as a first sensing margin, and stores at least one lower bit of the N-bit data in the second memory cell as a second sensing margin, smaller than the first sensing margin.

According to an example embodiment, an electronic device includes a first memory device having a memory cell array including a plurality of memory cells, a page buffer for reading N-bit data distributively stored in M memory cells connected to a bit line among the plurality of memory cells, based on the number of bit digits in the N-bit data, through the bit line, where M is a natural number of 2 or more, where N is a natural number more than or equal to M and an operation logic configured to process a neural network operation using the N-bit data, and a processor configured to receive result data of the neural network operation from the first memory device and to execute an application using the result data.

BRIEF DESCRIPTION OF DRAWINGS

The above and other aspects, features, and advantages of the present inventive concept will be more clearly understood from the following detailed description, taken in conjunction with the accompanying drawings, in which:

FIGS. 3 and 4 are diagrams illustrating an operation executed in operation logic of a memory device according to an example embodiment;

DETAILED DESCRIPTION

Hereinafter, example embodiments will be described with reference to the accompanying drawings.

Figure 1:
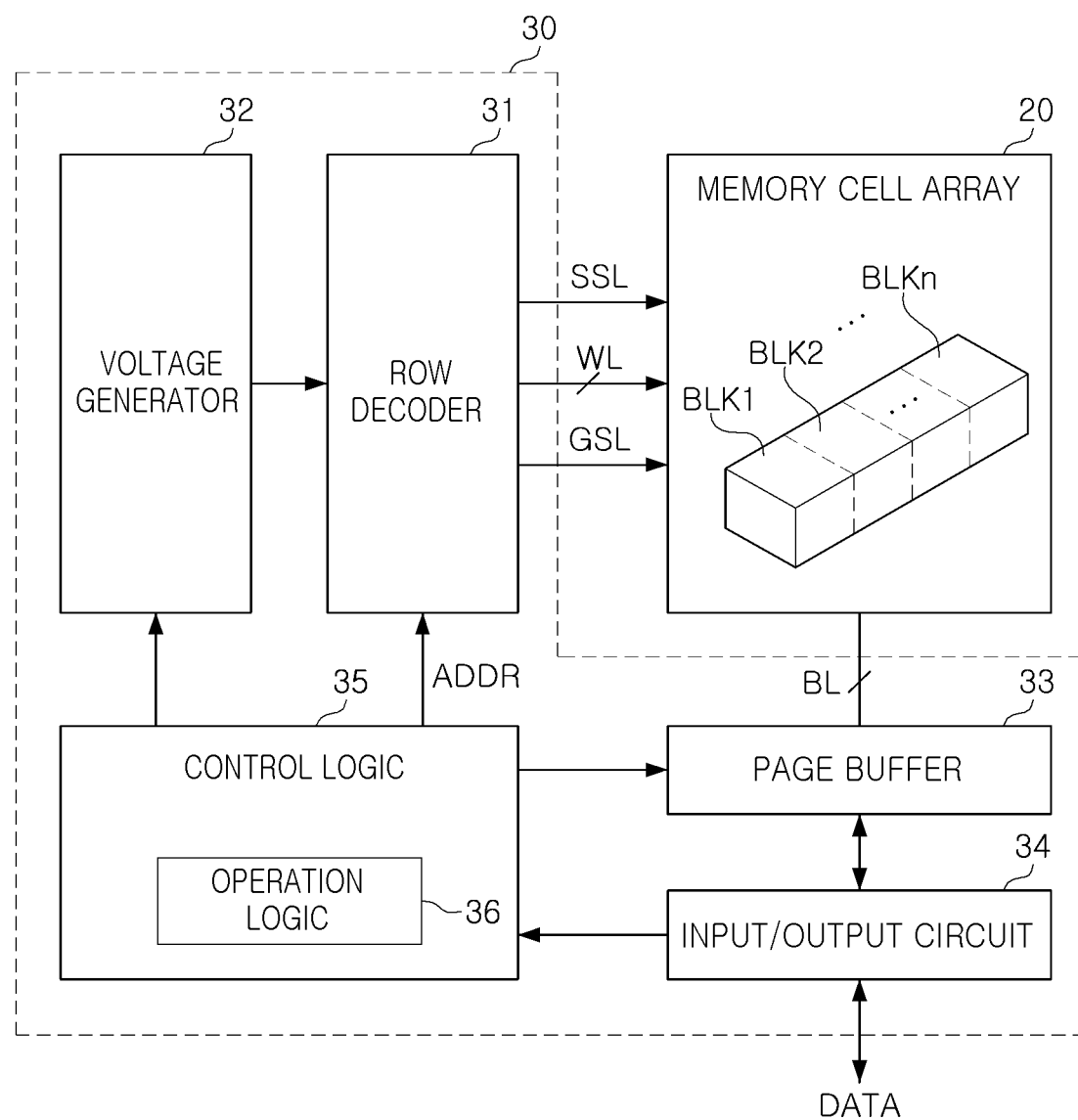
FIG. 1 is a block diagram of a memory device according to an example embodiment.

FIG. 1 is a schematic block diagram of a memory device according to an example embodiment.

Referring first to FIG. 1, a memory device 10 may include a memory cell array 20 and a peripheral circuit 30. The peripheral circuit 30 may include a row decoder 31, a voltage generator 32, a page buffer 33, an input/output circuit 34, control logic 35 and the like. The memory device may be, for example, a semiconductor device such as a semiconductor memory chip or a semiconductor memory package including one or more semiconductor chips mounted on a package substrate and encapsulated with an encapsulation layer.

The memory cell array 20 includes a plurality of memory cells, and may be divided into a plurality of blocks BLK1-BLKn. The plurality of memory cells may be connected to the row decoder 31 through a string select line SSL, word lines WL and a ground select line GSL, and may be connected to the page buffer 33 through bit lines BL. In an example, in the respective blocks BLK1-BLKn, the plurality of memory cells arranged at the same height from the substrate are connected to the same word line WL, and the plurality of memory cells disposed at the same position viewed from a plane parallel to the upper surface of the substrate may provide a memory cell string sharing one channel region. In addition, portions of the memory cell strings included in the respective blocks BLK1-BLKn may be connected to one bit line BL.

The row decoder 31 may decode address data ADDR received from the control logic 35 or the like, and may input voltages for driving the word line voltage to the word line WL. The row decoder 31 may input a word line voltage generated by the voltage generator 32 to the word lines WL in response to control of the control logic 35. In an example, the row decoder 31 may be connected to the word lines WL through pass transistors, and when the pass transistors are turned on, the word line voltage may be input to the word lines WL.

The page buffer 33 is connected to the memory cell array 20 through bit lines BL, and may read information stored in the memory cells or write data to the memory cells. The page buffer 33 may include a column decoder and a sense amplifier. The column decoder may select at least a portion of the bit lines BL of the memory cell array 20, and the sense amplifier may read data of a memory cell connected to the bit line BL selected by the column decoder during a reading operation.

The input/output circuit 34 may receive data (DATA) during a programming operation and may transfer the data to the page buffer 33. In a reading operation, the input/output circuit 34 may output the data read from the memory cell array 20 by the page buffer 33, to an external device or to the control logic 35. The input/output circuit 34 may transmit an address or command input from an external memory controller to the control logic 35.

The control logic 35 may control operations of the row decoder 31, the voltage generator 32, and the page buffer 33. In an example embodiment, the control logic 35 may operate by an external voltage and a control signal transmitted from an external memory controller or the like. The control logic 35 may include an operation logic 36, and in an example embodiment, in the operation logic 36, a neural network calculation using predetermined weight data, for example, a convolution calculation, or the like, may be executed. The operation logic described herein may be implemented using one or more circuits, such as logic circuits, configured to perform the various calculations and to execute the various operations described herein. In some embodiments, the operation logic may be implemented using certain logic circuits, for example programmable logic circuits, as well as using software and/or firmware in combination with the logic circuits.

The voltage generator 32 may generate control voltages required for the operation of the memory device 10, for example, a programming voltage, a reading voltage, an erase voltage, and a pass voltage, using a power voltage input from the outside. The voltage generated by the voltage generator 32 may be supplied to the peripheral circuit 30 or input to the memory cell array 20.

Figure 2:
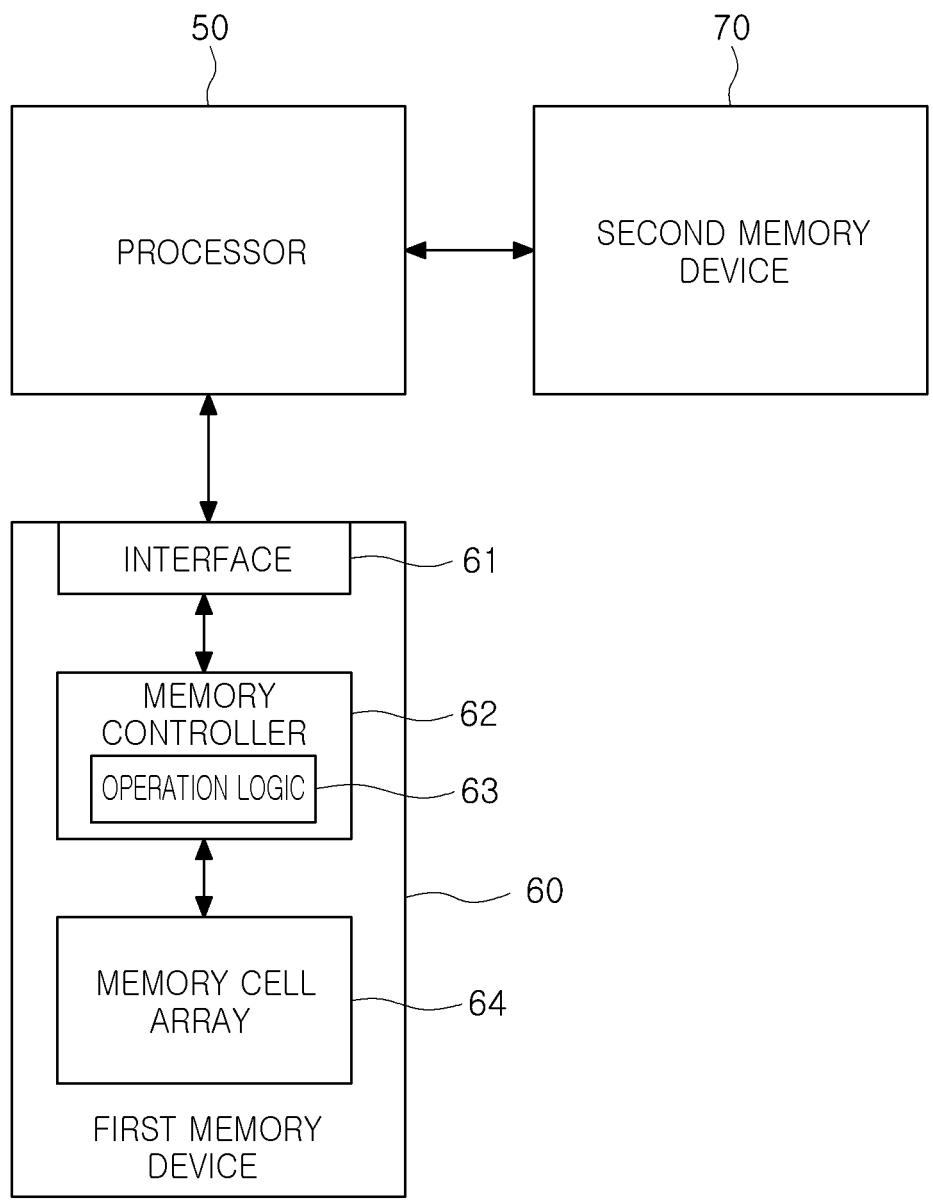
FIG. 2 is a schematic block diagram of an electronic device according to an example embodiment.

FIG. 2 is a schematic block diagram of an electronic device according to an example embodiment.

Referring to FIG. 2, an electronic device 40 according to an example embodiment may include a processor 50, a first memory device 60, a second memory device 70 and the like. The electronic device 40 may be a computer device such as a desktop computer or a laptop computer, or a mobile device such as a smart phone, a tablet PC, or a wearable device, which are only provided as examples. Thus, the electronic device 40 may include all other devices, including the memory devices 60 and 70 and the processor 50 having an arithmetic function. The memory devices 60 and 70 may each be a memory device such as described in FIG. 1.

The processor 50 is a semiconductor device capable of executing operations, and may be implemented as an application processor, a system-on-chip, a central processing unit, and the like. The first memory device 60 is a memory device having non-volatile characteristics, and may include an interface 61 for communication with the processor 50, a memory controller 62, and a memory cell array 64. The memory controller 62 may control memory cells included in the memory cell array 64. The second memory device 70 may be a memory device having different characteristics from the first memory device 60, and may have volatile characteristics, for example.

The memory controller 62 of the first memory device 60 may include operation logic 63. The operation logic 63 may execute at least a portion of the operations required to implement a neural network or the like, and, for example, the convolution operation may be executed in the operation logic 63.

In the case in which the operations required to implement the functions of the electronic device 40 are executed in the processor 50, the performance of the electronic device 40 may be deteriorated. In general, a processor may access a first memory device having non-volatile characteristics through a second memory device having volatile characteristics, and most of data required for the calculation may be stored in the first memory device having non-volatile characteristics. Accordingly, in this method, due to the limitation of the data transmission path between the processor and the first memory device, the performance of the electronic device may deteriorate.

On the other hand, in an example embodiment of the present inventive concept, as illustrated in FIG. 2, the processor 50 and the first memory device 60 (e.g., a non-volatile memory device) may directly communicate through the interface 61, without intervention of the second memory device 70. In addition, the operation logic 63 of the first memory device 60 may directly execute calculation using data stored in the memory cell array 64 and may transmit the result data to the processor 50. In an example, the operation logic 63 processes calculation with a relatively large amount of data transmission, for example, a convolution operation, and the processor 50 receives the result data, thereby reducing the amount of data transmitted between the processor 50 and the first memory device 60 and improving the performance of the electronic device 40.

FIGS. 3 and 4 are diagrams illustrating an operation executed in an operation logic of a memory device according to an example embodiment.

The operation described with reference to FIGS. 3 and 4 may be executed in operation logic mounted in (or included in) a memory device according to an example embodiment, and may be, for example, a convolution operation. In an example embodiment illustrated in FIG. 3, input data 81 may have a magnitude of 6×4, weight data 82 may have a magnitude of 2×2, and output data 83 may have a magnitude of 5×4. However, the respective magnitudes of the input data 81, the weight data 82, and the output data 83 may be variously modified, depending on example embodiments.

The operation logic may execute convolution operations while classifying the data included in the input data 81 into windows of a predetermined size. Referring to FIG. 4, the operation logic may execute a convolution operation using the weight data 82 by selecting a 2×2 window from the input data 81, which is provided as an example. Thus, the size of the window applied to the input data 81 by the operation logic may be variously changed.

The convolution operation may be executed as illustrated in FIG. 4. In detail, as illustrated in FIG. 4, a first output value $S_0$ of the output data 83 may be calculated by multiplying the data ×0, ×1, ×6 and ×7 included in the window selected from the input data 81 by weight data W0, W1, W2 and W3, respectively, and by summing the results of the multiplication, as illustrated in FIG. 4. Similarly, the second output value $S_1$ of the output data 83 may be calculated by multiplying the data ×1, ×2, ×7 and ×8 included in the window selected from the input data 81 by weight data W0, W1, W2 and W3, respectively, and by summing the results of the multiplication. Similar output data may be calculated for $S_2$ through $S_4$. Then, the sixth output value $S_6$ of the output data 83 may be calculated by multiplying the data ×6, ×7, ×12 and ×13 included in the window selected from the input data 81 by weight data W0, W1, W2 and W3, respectively, and by summing the results of the multiplication. This process continues through the final output value $S_{16}$. Other types of convolution operations may be executed as well, according to known calculation methods, using input data and weight data to calculate output data for various applications.

The computation amount of the convolution operation may be influenced by the magnitude of the input data 81 and the weight data 82. When the magnitude of the input data 81 and/or the weighted data 82 increases, the computation amount may increase and the processing speed may decrease. The input data 81, also described as basic data, includes information, other than weight data, stored and used for the computation. Typically, the basic data includes bits that represent user data, image data, measured data, or other data whose value is intended to be precise as opposed to weight data, which is data representing relative importance.

In example embodiments, a method for improving the processing speed is provided. In an example embodiment, the weighted data 82 may be divided depending on the number of bit digits and distributively stored in two or more memory cells. For example, when the data of the upper bit is stored in the first memory cell and the data of the lower bit is stored in the second memory cell, the first memory cell may have higher reliability than the second memory cell.

By a controller of the memory device, an error correction process, such as an error correction code (ECC) decoding process, for the read weight data 82 in a reading operation of reading the weight data 82, may be omitted. Since the data of the upper bit, which greatly affects the accuracy of the convolution operation, is stored in a memory cell having high reliability, an error detection process may be omitted, and a convolution operation may be executed by approximate computing. By omitting the error detection process, the processing speed of the convolution operation may be improved. In addition, in an example embodiment, to accurately read data of an upper bit that greatly affects the accuracy of a convolution operation, memory cells in which the weighted data 82 is distributively stored by bit digits may be read in different methods.

Figure 5:
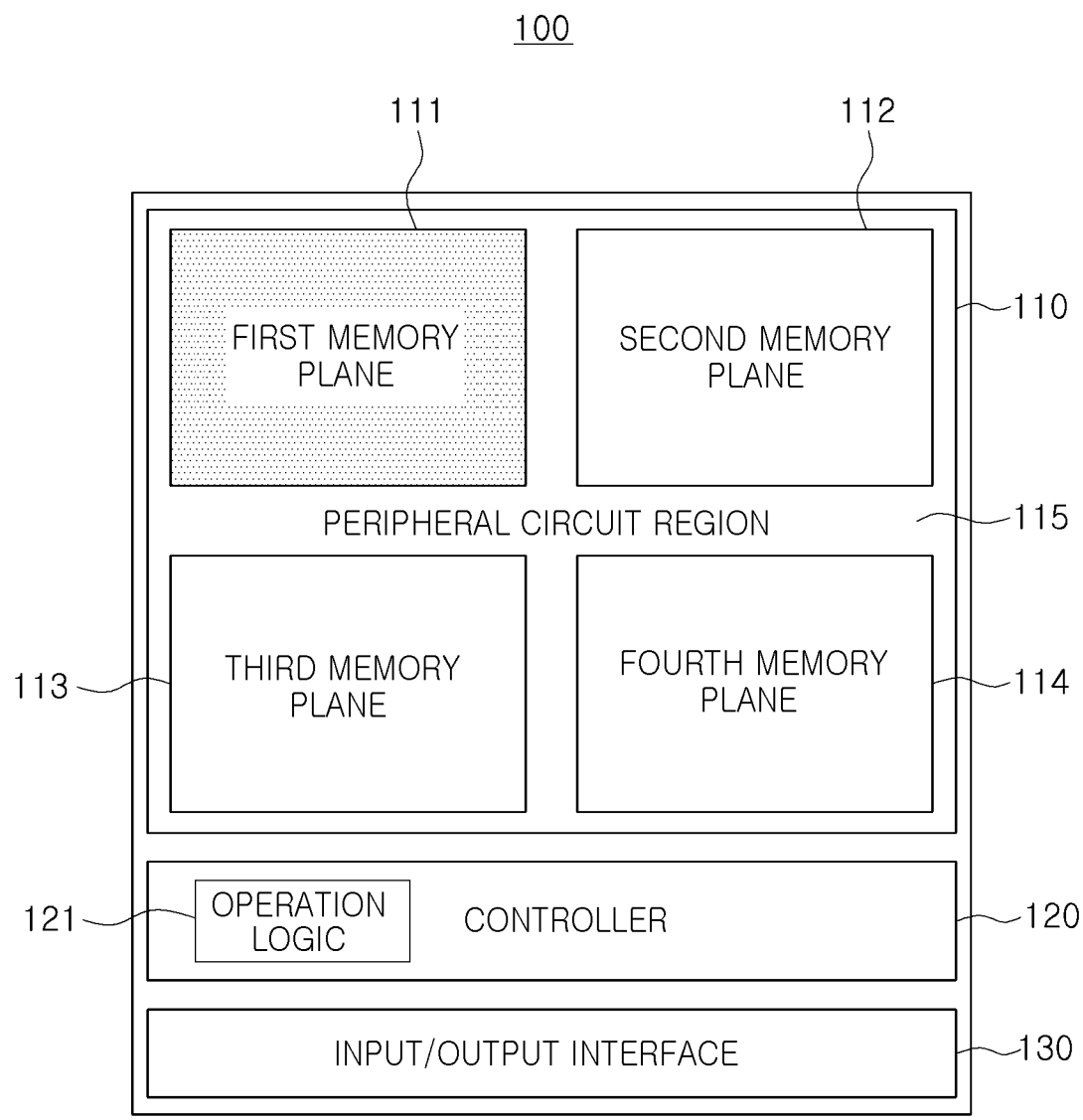
FIGS. 5 and 6 are diagrams illustrating an operation of the memory device according to example embodiments.
Figure 6:
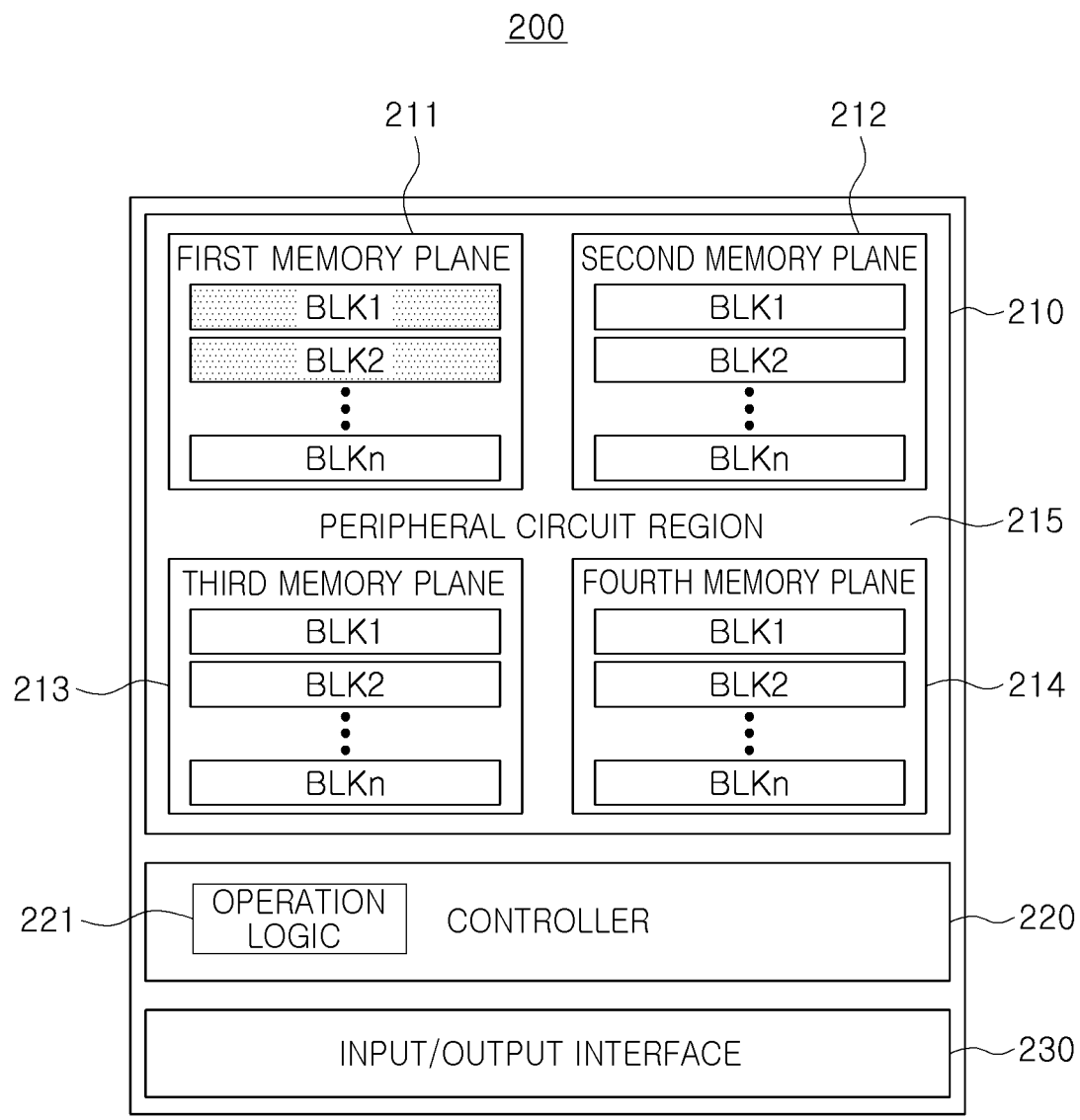

FIGS. 5 and 6 are diagrams illustrating operations of memory devices according to example embodiments.

Referring to FIGS. 5 and 6, memory devices 100 and 200 according to example embodiments may include memory areas 110 and 210, controllers 120 and 220, and input/output interfaces 130 and 230. The memory areas 110 and 210 may include a plurality of memory planes 111-114 and 211-214 and peripheral circuit regions 115 and 215. Each of the memory planes 111-114 and 211-214 may include memory cells, such as an array of memory cells, and in an example embodiment, the peripheral circuit regions 115 and 215 may be disposed below the memory cells.

The controllers 120 and 220 may control the memory areas 110 and 210 to store data or read data, while exchanging data with an external device through the input/output interfaces 130 and 230. In addition, the controllers 120 and 220 may include operation logics 121 and 221 that execute calculations to implement a neural network using data stored in the memory areas 110 and 210. The controllers 120 and 220 may be a separate chip or separate package from the memory areas 110 and 210 (which may be on a separate memory chip). For example, in some embodiments, a first semiconductor chip (e.g., die formed on a wafer) may include the controller (e.g., 120 or 220) and a second semiconductor chip (e.g., die formed on a wafer) may include the memory area (e.g., 110 or 210). The two semiconductor chips may be stacked on each other, or positioned side by side, and included in a package. Alternatively, the controller 120 and memory area 110 may be formed on a single semiconductor chip, and/or the controller 220 and memory area 210 may be formed on a single semiconductor chip. The memory device 100 may be a single semiconductor memory chip, a semiconductor package, or a plurality of semiconductor packages.

For example, the operation logics 121 and 221 may execute neural network calculations or the like using weight data stored in the memory areas 110 and 210. In an example embodiment illustrated in FIG. 5, the weight data may be stored in the first memory plane 111, and in an example embodiment illustrated in FIG. 6, the weight data may be stored in at least some of blocks BLK1-BLKn of the first memory plane 211.

In an example embodiment, input data used for neural network computation may be stored separately from weight data. In the example embodiment illustrated in FIG. 5, the input data may be stored in other memory planes 112-114 except for the first memory plane 111. In the example embodiment illustrated in FIG. 6, input data may be stored in blocks BLK1-BLKn in which weight data is not stored.

Figure 7:
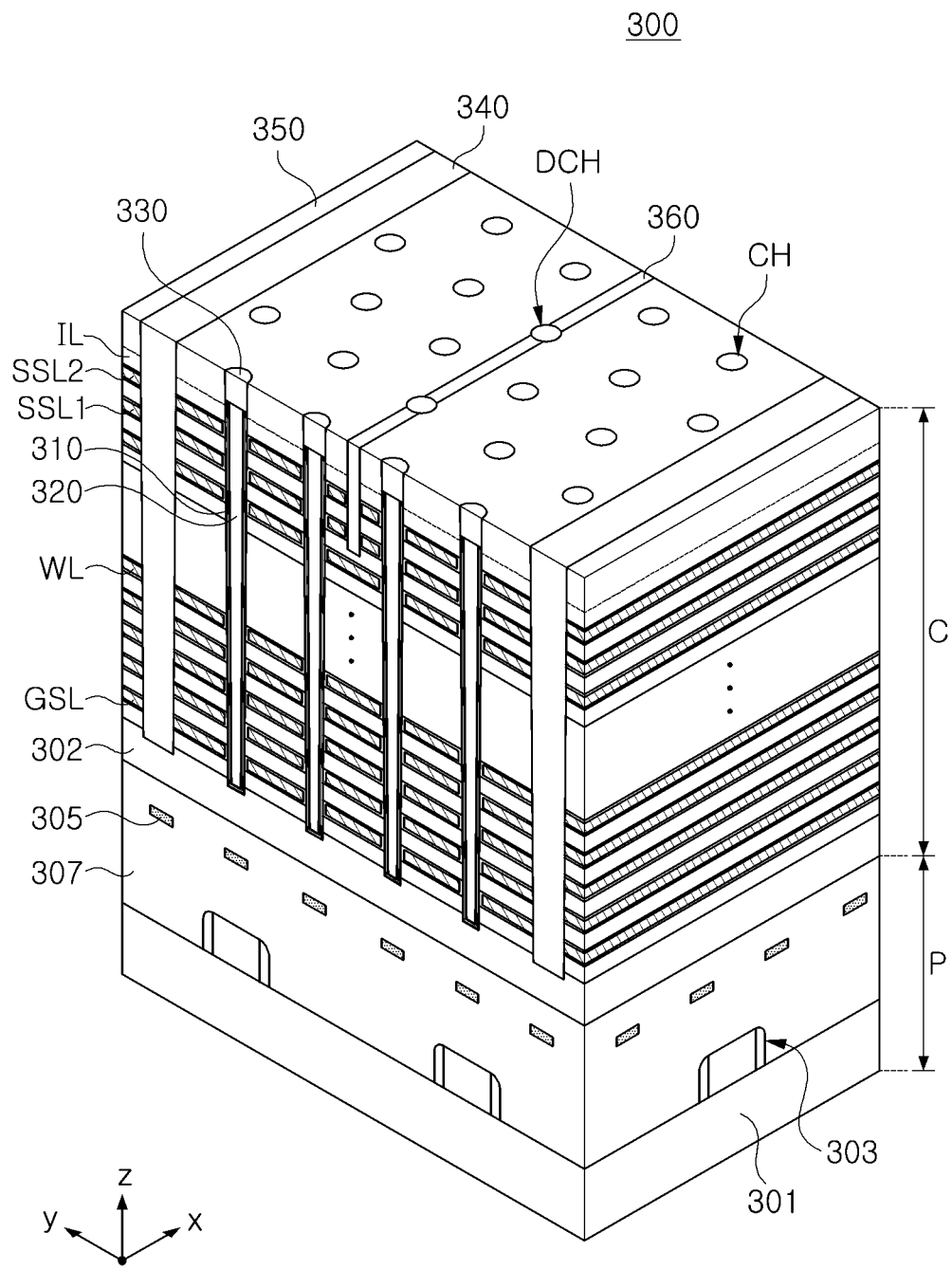
FIGS. 7 and 8 are views schematically illustrating a structure of a memory device according to an example embodiment.
Figure 8:
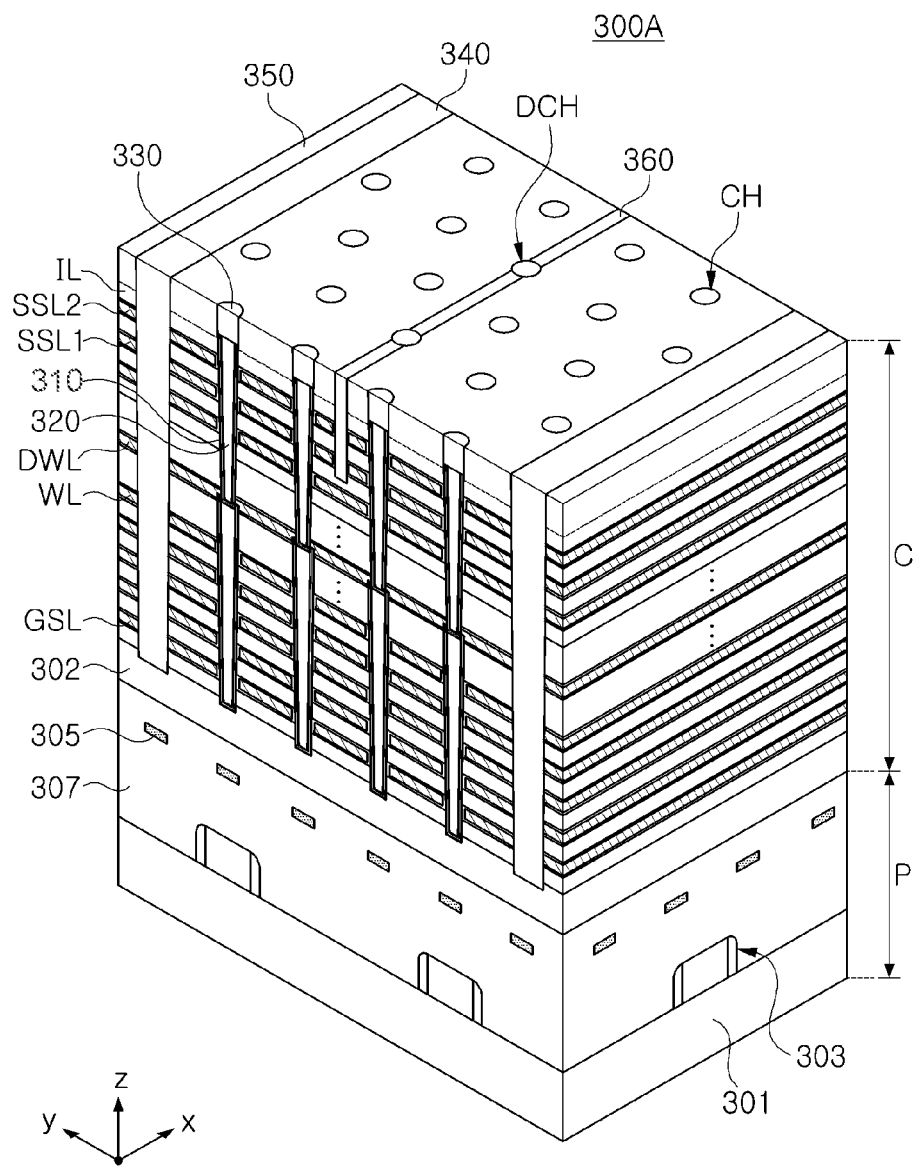

FIGS. 7 and 8 are diagrams schematically illustrating structures of memory devices according to example embodiments.

FIGS. 7 and 8 are perspective views that illustrate memory devices 300 and 300A according to example embodiments. First, referring to FIG. 7, the memory device 300 according to an example embodiment may include a cell region C and a peripheral circuit region P that are disposed above and below each other. The peripheral circuit region P may be disposed below the cell region C, and the peripheral circuit region P includes a first substrate 301, and the cell region C includes a second substrate 302 different from the first substrate 301.

For example, the peripheral circuit region P includes a plurality of peripheral circuit elements 303 provided on the first substrate 301, a plurality of wiring lines 305 connected to the peripheral circuit elements 303, and a first interlayer insulating layer 307 covering the peripheral circuit elements 303 and the wiring lines 305. The peripheral circuit elements 303 included in the peripheral circuit region P may provide circuits required to drive the memory device 300, for example, a page buffer, a row decoder circuit, and the like.

The second substrate 302 included in the cell region C may be disposed on the first interlayer insulating layer 307. The cell region C includes ground select lines GSL, word lines WL, string select lines SSL1 and SSL2, and a plurality of insulating layers IL stacked on the second substrate 302. The insulating layers IL may be alternately stacked with the ground select line GSL, the word lines WL, and the string select lines SSL1 and SSL2. The numbers of ground select lines GSL and string select lines SSL1 and SSL2 are not limited to the numbers illustrated in FIG. 7 and may be variously modified.

In addition, the cell region C may include channel structures CH extending in a first direction (a Z-axis direction) perpendicular to the upper surface of the second substrate 302, and the channel structures CH may be connected to the second substrate 302 through the ground select line GSL, the word lines WL, and the string select lines SSL1 and SSL2. The channel structures CH may include a channel region 310, a filled insulating layer 320 filling an internal space of the channel region 310, a bit line connection layer 330, and the like. Each of the channel structures CH may be connected to at least one bit line through the bit line connection layer 330. The ground select line GSL, the word lines WL, the string select lines SSL1 and SSL2, the insulating layers IL, and the channel structures CH may be defined as a stacked structure.

At least one gate insulating layer may be disposed outside of the channel region 310. In an example embodiment, the gate insulating layer may include a tunneling layer, a charge storage layer, and a blocking layer sequentially disposed from the channel region 310. According to an example embodiment, at least one of the tunneling layer, the charge storage layer, and the blocking layer may be formed in a shape surrounding the ground select lines GSL, the word lines WL, and the string select lines SSL1 and SSL2.

The ground select line GSL, the word lines WL, and the string select lines SSL1 and SSL2 may be covered by an interlayer insulating layer 350. Also, the ground select line GSL, the word lines WL, and the string select lines SSL1 and SSL2 may be divided into a plurality of regions by word line cuts 340. In an example embodiment, the string select lines SSL1 and SSL2 may be divided into a plurality of regions by an isolation insulating layer 360, in a second direction (a Y-axis direction) parallel to the upper surface of the second substrate 302, between a pair of word line cuts 340 adjacent to each other.

In an example embodiment, dummy channel structures DCH may be provided in a region in which the isolation insulating layer 360 is disposed. The dummy channel structures DCH may have the same structure as the channel structures CH, but may not be connected to the bit line.

In the example embodiment illustrated in FIG. 7, the channel structures CH and the word line cuts 340 have a shape extending in a first direction, and thus the widths thereof may be changed. Referring to FIG. 7, the channel structures CH and the word line cuts 140 may have a tapered structure having a gradually narrowing width as approaching the second substrate 302.

Next, referring to FIG. 8, the memory device 300A according to an example embodiment may include a cell region C and a peripheral circuit region P that are disposed above and below each other. The memory device 300A according to the example embodiment illustrated in FIG. 8 may have a structure similar to the memory device 300 according to the example embodiment illustrated in FIG. 7, and thus, descriptions of features that may be understood with reference to FIG. 7 will be omitted.

In the example embodiment illustrated in FIG. 8, to reduce process difficulties due to an increase in the number of word lines WL, after some word lines WL are stacked and a lower channel structure is formed, the remaining word lines WL may be stacked and an upper channel structure may be formed. Accordingly, as illustrated in FIG. 8, each of the channel structures CH may include an upper channel structure and a lower channel structure. For example, the lower channel structure and the word lines through which the lower channel structure penetrates may be defined as a lower stacked structure, and the upper channel structure and the word lines through which the upper channel structure penetrates may be defined as an upper stacked structure.

The lower channel structure may extend from the second substrate 302, and the upper channel structure may extend from the lower channel structure to be connected to the bit line through the bit line connection layer 330. In each of the channel structures CH, the channel region 310 of the upper channel structure and the channel region 310 of the lower channel structure may be connected to each other.

The upper channel structure, the lower channel structure, and the word line cuts 340 may have a tapered structure that becomes narrower as they approach the second substrate 302 in the first direction (the Z-axis direction). In the example embodiment illustrated in FIG. 8, the upper channel structure and the lower channel structure in each of the channel structures CH may have a tapered structure. The characteristics of the memory cell may deteriorate in an area adjacent to a boundary where the upper channel structure and the lower channel structure are connected to each other. Accordingly, a dummy word line DWL may be disposed in an area adjacent to the boundary. The dummy word line DWL may be connected to a dummy memory cell, and valid data may not be stored in the dummy memory cell. The number of dummy word lines DWL disposed in the region adjacent to the boundary may be plural.

In an example embodiment, the operation logics mounted inside the memory devices 300 and 300A may execute a predetermined calculation using weighted data stored in memory cells. The weight data may be divided based on the number of bit digits and may be stored in two or more memory cells, and the data of the upper bit or bits that greatly affects the operation result may be stored in a memory cell having relatively high reliability.

For example, in the memory devices 300 and 300A according to the example embodiments illustrated in FIGS. 7 and 8, as the channel structures CH and the word line cuts 340 have a tapered structure, the word lines WL may have different resistance characteristics. Accordingly, the data of the upper bit(s) among the weight data may be stored in the memory cell connected to the word line WL having a low resistance, and the data of the lower bit(s) may be stored in the memory cell connected to the word line WL having a high resistance.

Alternatively, different programming schemes may be applied depending on the number of digits of the weighted data, independent of the resistance characteristics of the word lines WL. In an example, data of the upper bit(s) may be programmed to have a relatively wide sensing margin, and data of the lower bit(s) may be programmed to have a relatively narrow sensing margin. Alternatively, data of the upper bit(s) may be stored in a memory cell in a single level cell (SLC) method, and data of the lower bit(s) may be stored in memory in a multi level cell (MLC), triple level cell (TLC), or quad level cell (QLC) method.

Figure 9:
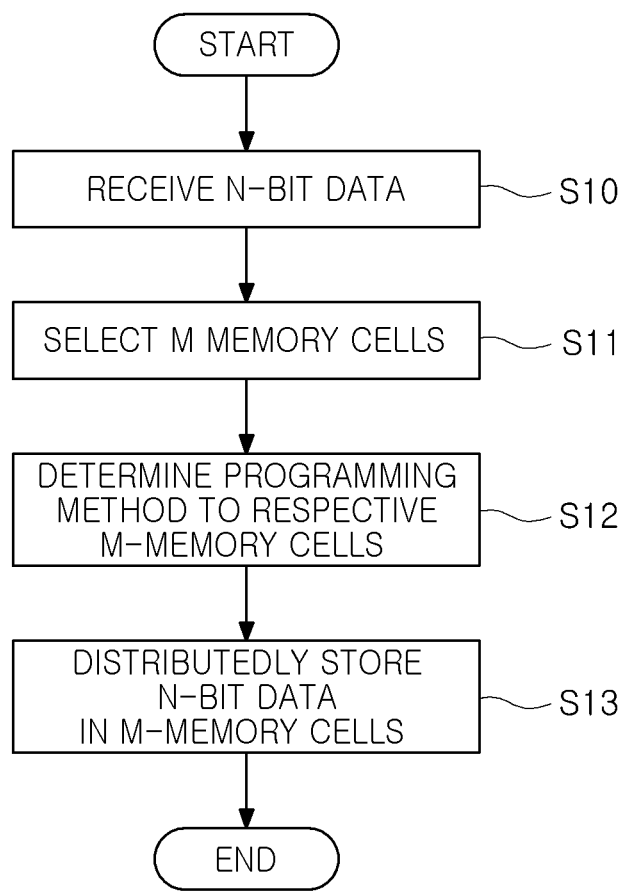
FIG. 9 is a flowchart illustrating the operation of a memory device according to an example embodiment.

FIG. 9 is a flowchart illustrating the operation of a memory device according to an example embodiment.

Referring to FIG. 9, the operation of the memory device according to an example embodiment may be started by receiving N-bit data by the memory device (S10). N may be a natural number, for example, 2 or more. For example, the N-bit data received by the memory device may be data used to execute a predetermined operation in operation logic mounted inside the memory device. For example, the operation logic may execute a portion of the operations required for the neural network, for example, a convolution operation, and the N-bit data may be weight data used for the convolution operation.

When N-bit data is received, the memory controller of the memory device may select M memory cells (S11). In an example, M is a natural number of 2 or more and may be less than or equal to N. In an example embodiment, the M memory cells selected by the memory controller may share one channel region. As one example, M memory cells may be connected to one bit line and may be included in one memory cell string.

In an example embodiment, the M memory cells may be continuously (e.g., consecutively) disposed in the memory cell array. As described above with reference to FIGS. 7 and 8, memory cells may be provided by word lines stacked in a memory cell array and a channel region penetrating through the word lines. The M memory cells selected by the memory controller in operation S11 may be memory cells provided by M word lines sequentially stacked.

When M memory cells are selected, the memory controller may determine a programming method for each of the M memory cells (S12), and may distributively store N-bit data in the M memory cells (S13). In one example, the M memory cells include a first memory cell and a second memory cell, and a sensing margin of the first memory cell may be different from a sensing margin of the second memory cell. In an example embodiment, both the first memory cell and the second memory cell may be programmed in an SLC method, and sensing margins may be different.

In an example embodiment, the number of bits of data stored in the first memory cell may be different from the number of bits of data stored in the second memory cell. In an example, the first memory cell may be programmed in an SLC method, and the second memory cell may be programmed in an MLC method, a TLC method, or a QLC method. For example, a memory controller may be configured to store first data (e.g., a first number of bits of the N-bit data) in the first memory cell according to an SLC method, and to store second data (e.g., a second number of bits of the N-bit data) in the second memory cell according to an an MLC method, a TLC method, or a QLC method. Alternatively, the first memory cell may be programmed in SLC or MLC, and the second memory cell may be programmed in TLC or QLC.

The memory controller may divide N bits of data into M pieces depending on the number of bits, and may store the M pieces in M memory cells. For example, when 3 bits of data are stored in 3 memory cells, the memory controller may store 1 bit of data in each of the 3 memory cells. For example, when 8-bit data is stored in three memory cells, the memory controller may store two-bit data in one memory cell and may store three-bit data in each of other two memory cells.

In operation S13, the memory controller may store data of the upper bit among N-bit data (e.g., a most significant bit, or set of bits including and closest to the most significant bit) in a memory cell having relatively high reliability, and data of the lower bit (e.g., a least significant bit, or set of bits including and closest to the least significant bit) in a memory cell having relatively low reliability. For example, when 8-bit data is stored in 3 memory cells, the upper 2-bit data may be stored in a memory cell programmed by the MLC method (e.g., for storing 2 bits), and the remaining 6-bit data may be divided and stored in two other memory cells programmed by the TLC method. Also, as an example, when storing data of bits in three memory cells, the memory controller may store the most significant bit in the memory cell having a widest sensing margin, and the least significant bit in a memory cell having a narrowest sensing margin.

By storing upper bit data in the memory cell having highest reliability, an error detection and correction process may be omitted in a reading operation of reading N-bit data to execute an operation using N-bit data. Since sufficient reliability may be secured for the data of the upper bit, which greatly affects the accuracy of the operation using N-bit data, the error detection and correction process of the reading operation may be omitted, and as a result, approximate computing with an improved operation processing speed may be implemented. This is particularly useful for weight data, which is typically used to determine a relative weight and may not require precise accuracy.

Figure 10:
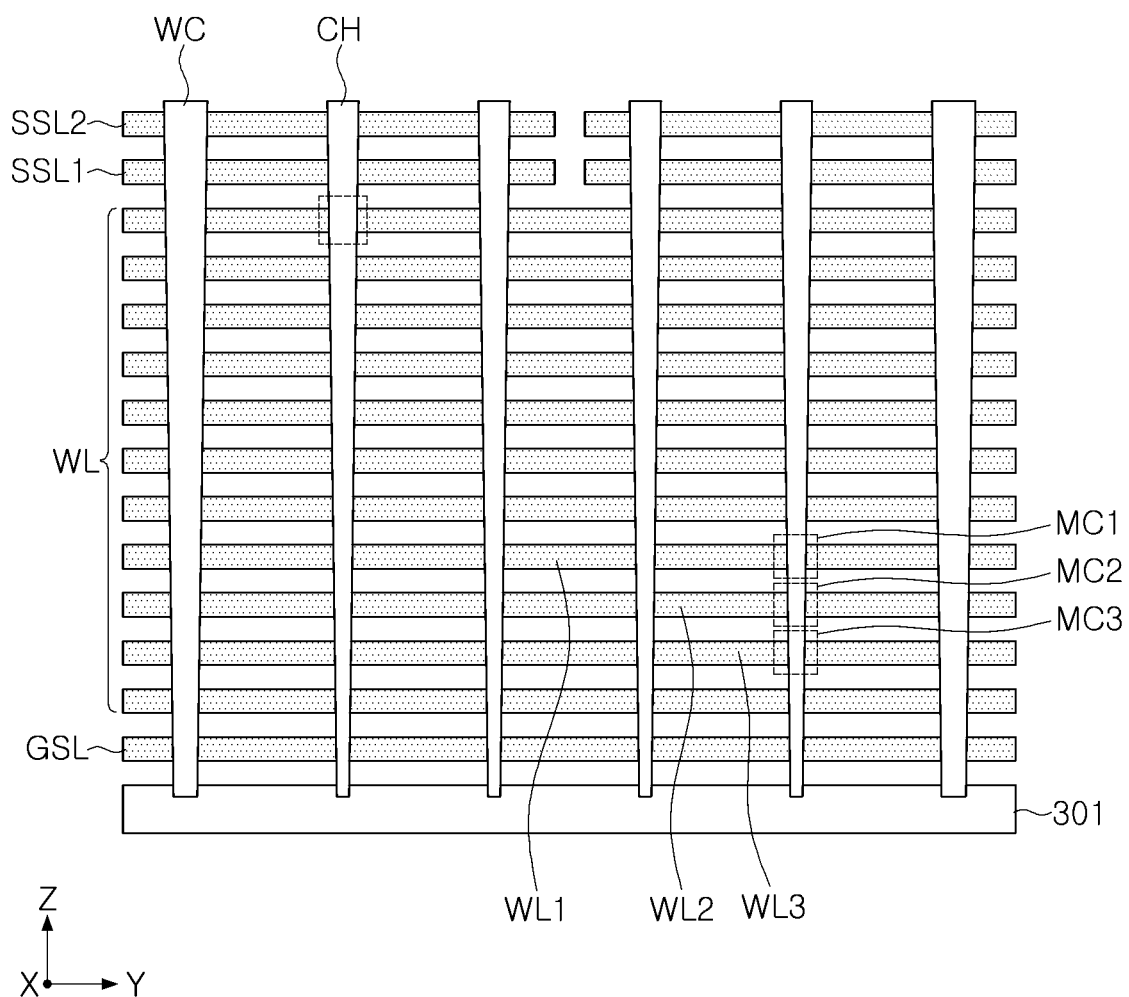
FIGS. 10 and 11 are diagrams illustrating the operation of a memory device according to an example embodiment.
Figure 11:
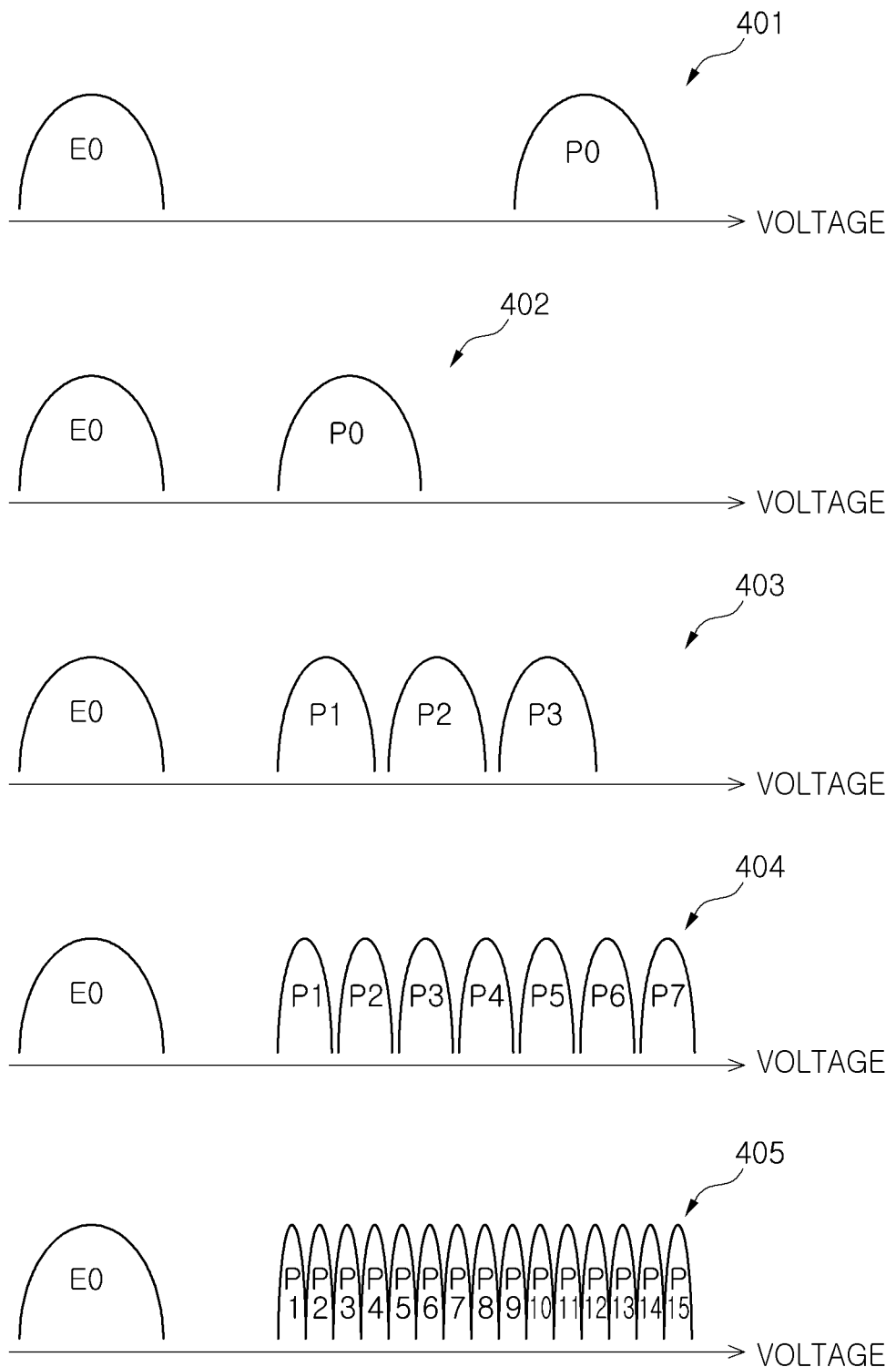

FIGS. 10 and 11 are diagrams illustrating operations of a memory device according to an example embodiment.

Referring first to FIG. 10, the memory device 300 according to an example embodiment may include the ground select line GSL, the word lines WL, and the string select lines SSL1 and SSL2 stacked on an upper surface of a substrate 301. The ground select line GSL, the word lines WL, and the string select lines SSL1 and SSL2 may be divided into a plurality of regions by word line cuts WC, and the string select lines SSL1 and SSL2 may be divided into a plurality of regions, between a pair of word line cuts WC. The number of ground select lines GSL and string select lines SSL1 and SSL2 may be variously modified.

The ground select line GSL, the word lines WL, and the string select lines SSL1 and SSL2 may be penetrated by the channel structures CH. Each of the channel structures CH may include a channel region extending in a direction perpendicular to the upper surface of the substrate 301, and a gate insulating layer disposed between the channel region and the word lines WL. The memory device 300 of FIG. 10 may be, for example, a three-dimensional NAND type memory.

The memory controller of the memory device 300 includes operation logic that executes an operation for implementing a neural network, and for example, the operation logic may execute a neural network operation using pre-stored weighted data. The operation logic reads the weight data stored in the memory cells and executes the calculation. To omit the error detection and correction process in the reading operation of reading the weight data, the data of the upper bit of the weight data may be stored in the memory cell having higher reliability.

For example, when the weight data is N-bit data, the memory controller may divide N-bit data based on the number of bit digits and store the N-bit data distributively in M memory cells. In the example embodiment illustrated in FIG. 10, N-bit data may be stored in three memory cells MC1-MC3. The three memory cells may be connected to three word lines WL1-WL3 sequentially stacked, which is only an example. Thus, word lines WL1-WL3 connected to M memory cells MC1-MC3, in which N-bit data are distributively stored, may be disposed separately from each other.

FIG. 11 depicts graphs illustrating a programming method of a memory cell. First, a first graph 401 and a second graph 402 are graphs illustrating a threshold voltage distribution of a memory cell programmed by the SLC method. The memory cell programmed by the SLC method may have one of an erasing state (EO) and a programming state (PO). Depending on the magnitude of the programming voltage input to the word line connected to the memory cell in the programming operation, and/or the number of programming operations executed in the incremental step pulse program (ISPP) method, the threshold voltage distribution of the memory cell may be changed as illustrated in the first graph 401 and the second graph 402. For example, in the ISPP-type programming operation, as the number of times the programming voltage is input increases, the threshold voltage distribution of the memory cell may have a relatively wide sensing margin as in the first graph 401. As shown in FIG. 11, a minimum threshold voltage value for the threshold voltage distribution of a first memory cell shown in graph 401 may be greater than a maximum threshold voltage value for the threshold voltage distribution of a second memory cell shown in graph 402. The first memory cell may be adjacent to the second memory cell, as discussed, for example, with respect to FIG. 10, or may not be adjacent to the second memory cell.

A third graph 403 represents a threshold voltage distribution of the memory cell programmed by the MLC method, a fourth graph 404 represents a threshold voltage distribution of the memory cell programmed by the TLC method, and a fifth graph 405 represents a threshold voltage distribution of the memory cell programmed by the QLC method. As the number of bits of data stored in one memory cell increases, a sensing margin between threshold voltage distributions may decrease.

Referring to FIG. 10 and FIG. 11 together, when storing N bits of data (N is a natural number of 3 or more) in three memory cells MC1-MC3, data of the upper bits among N bits of data may be programmed to have a relatively high sensing margin, and data of lower bits may be programmed regardless of the sensing margin; which may be because the upper bit data has a relatively greater influence on the operation result in the operation using N-bit data. Therefore, when reading N-bit data from the three memory cells MC1-MC3, the error detection and correction process may be omitted by estimating that there is no error in the data of the upper bit, and thus, approximate computing may be implemented, thereby improving the processing speed of operations using N-bit data.

In addition, in an example embodiment, data of an upper bit among N-bit data may be stored in a memory cell connected to a word line having relatively better resistance characteristics. Referring to FIG. 10, the channel structures CH and the word line cuts WC may have a tapered structure in which the width in the X-Y direction decreases as approaching the substrate 301, and the third word line WL3 may have a lower resistance than that of the first word line WL1. When the N-bit data is stored in the three memory cells MC1-MC3, the upper bit data is stored in the third memory cell MC3 (e.g., a memory cell having relatively lower resistance, which may be closer to the substrate and may have a channel with a smaller cross-sectional area and smaller volume), and the lower bit data is stored in the first memory cell MC1, thereby increasing the reliability of data and omitting the error detection and correction process in the reading operation.

FIGS. 12 to 17 are diagrams illustrating a programming operation of a memory device according to example embodiments.

Figure 12:
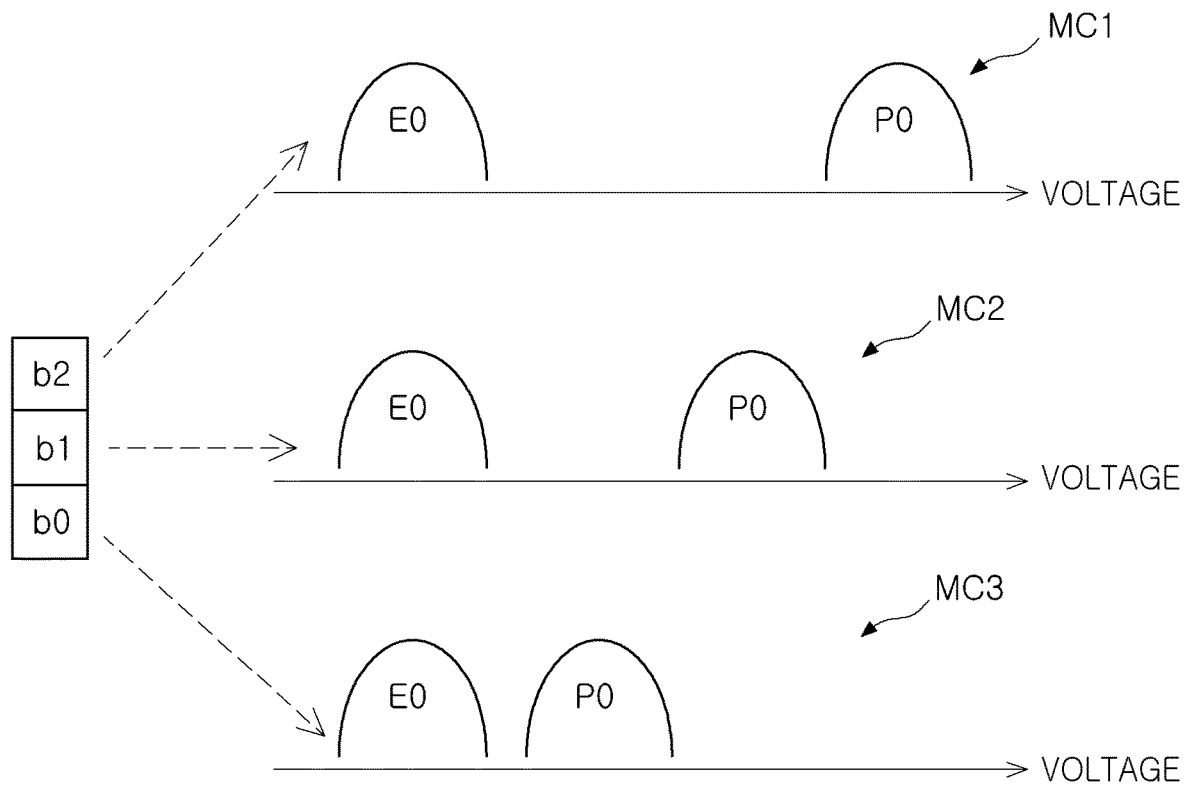
FIGS. 12 to 17 are diagrams illustrating a programming operation of a memory device according to example embodiments.
Figure 13:
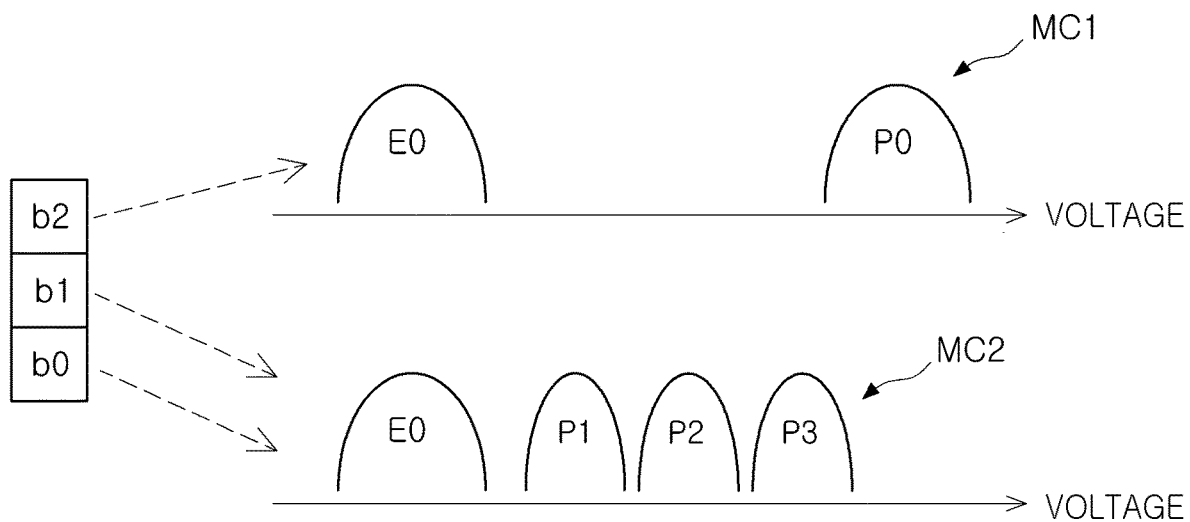

First, FIGS. 12 and 13 are diagrams illustrating example embodiments in which 3-bit data b2-b0 is distributively stored in a plurality of memory cells. In an example embodiment illustrated in FIG. 12, three bits of data b2-b0 may be distributively stored in three memory cells MC1-MC3 by one bit. Referring to FIG. 12, data b2 of the most significant bit (MSB) among the three bits of data b2-b0 may be stored in the first memory cell MC1 programmed to have a widest sensing margin. The data b0 of the least significant bit LSB may be stored in the third memory cell MC3 programmed to have a narrowest sensing margin. As an example, the data b2 of the most significant bit may be a sign bit. All three memory cells MC1-MC3 may be programmed in the SLC method. In an example embodiment, a maximum value of a threshold voltage distribution for the threshold voltage of the programming state PO of the third memory cell MC3 may be less than a maximum value of a threshold voltage distribution for the threshold voltage of the programming state PO of the first memory cell MC1.

As illustrated in FIG. 12, by storing the 3-bit data b2-b0 in the memory cells MC1-MC3, an error that may occur in the cases in which the most significant bit of data b2 is programmed into the first memory cell MC1, or the data b2 of the most significant bit is read from the first memory cell MC1 may be significantly reduced. Therefore, when executing an operation using 3 bits of data b2-b0, an error detection and correction process may be omitted from a reading operation of reading 3 bits of data b2-b0, and the operation processing speed may be improved.

In an example embodiment illustrated in FIG. 13, 3 bits of data b2-b0 may be distributively stored in two memory cells MC1 and MC2. Referring to FIG. 13, the data b2 of a most significant bit may be stored in the first memory cell MC1 programmed in an SLC method. The remaining 2 bits of data b1 and b0 may be stored in the second memory cell MC2 programmed in the MLC method. Accordingly, an error that may occur when programming the data b2 of the most significant bit or reading the data b2 of the most significant bit may be significantly reduced. Accordingly, when executing an operation using 3 bits of data b2-b0, an error detection and correction process may be omitted in a reading operation of reading 3 bits of data b2-b0, and thus, the operation processing speed may be improved.

Figure 14:
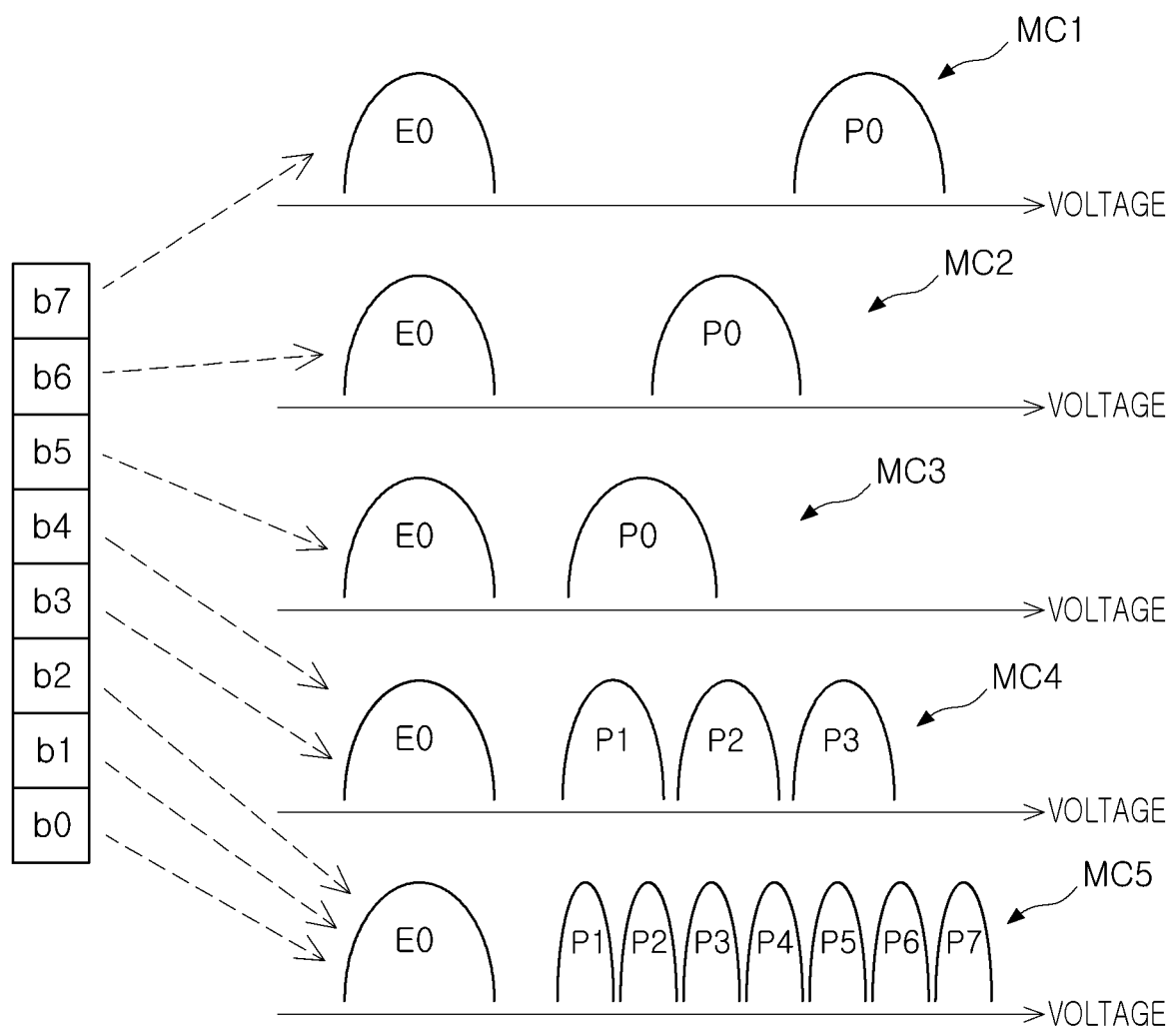
Figure 15:
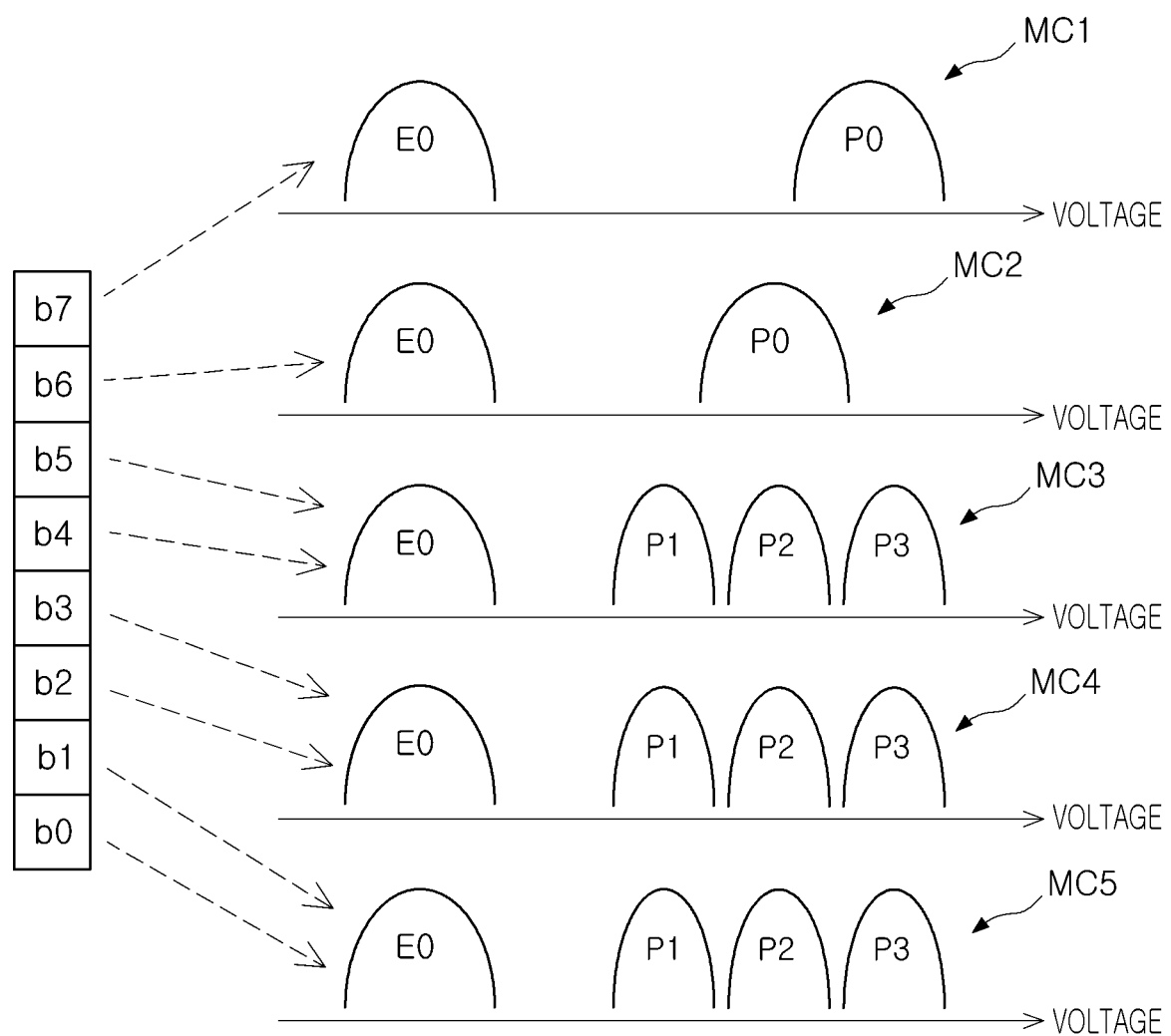

FIGS. 14 to 17 are diagrams illustrating example embodiments of distributively storing 8-bit data b7-b0 in a plurality of memory cells. Referring to FIGS. 14 and 15, 8-bit data b7-b0 may be distributively stored in five memory cells MC1-MC5. Referring first to FIG. 14, data of the upper 3 bits b7-b5 may be stored in first to third memory cells MC1-MC3 by 1 bit. The first to third memory cells MC1-MC3 may be programmed in an SLC method. For example, the data b7 of the most significant bit may be a sign bit, and the data b6 and b5 of the 2 bits following the most significant bit may be information bits. The first memory cell MC1 in which the data of the most significant bit b7 having a greatest influence on the result of the operation using the 8-bit data b7-b0 is stored may be programmed to have a widest sensing margin.

The lower 5 bits of data (b4-b0) may be distributively stored in the fourth memory cell MC4 programmed in the MLC method and the fifth memory cell MC5 programmed in the TLC method. Accordingly, among 8-bit data b7-b0, the lower bit may be stored in a memory cell having a relatively narrower sensing margin, and the upper bit may be stored in a memory cell having a relatively wider sensing margin.

Next, referring to FIG. 15, upper 2 bits of data b7 and b6 may be stored in the first and second memory cells MC1 and MC2 by one bit. The first and second memory cells MC1 and MC2 may be programmed in an SLC method. The first memory cell MC1 in which the data of the most significant bit b7 that has the greatest influence on the result of the operation using the 8-bit data b7-b0 is stored, may also be programmed to have a wider sensing margin than the second memory cell MC2, which is only an example. For example, the first memory cell MC1 and the second memory cell MC2 may also be programmed to have substantially the same sensing margin. The lower 6-bit data b5-b0 may be distributively stored in the third to fifth memory cells MC3-MC5 programmed in the MLC method.

Figure 16:
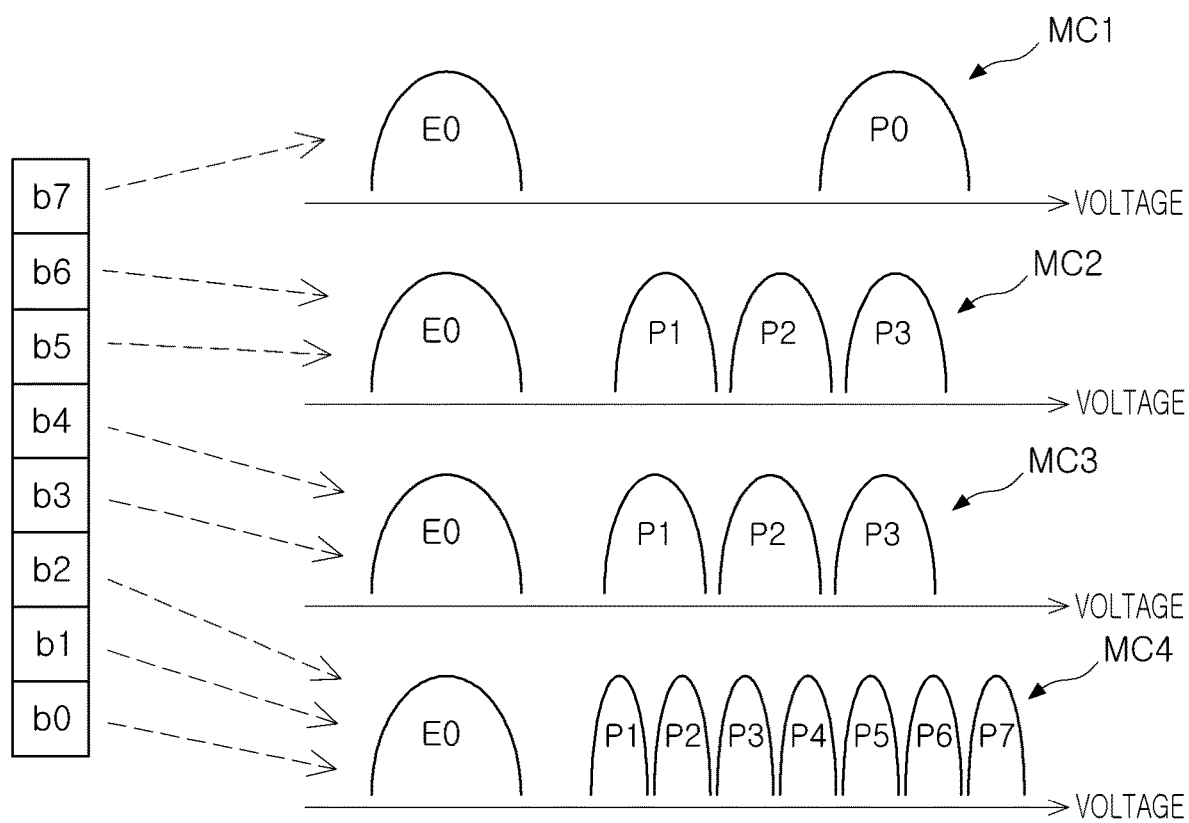
Figure 17:
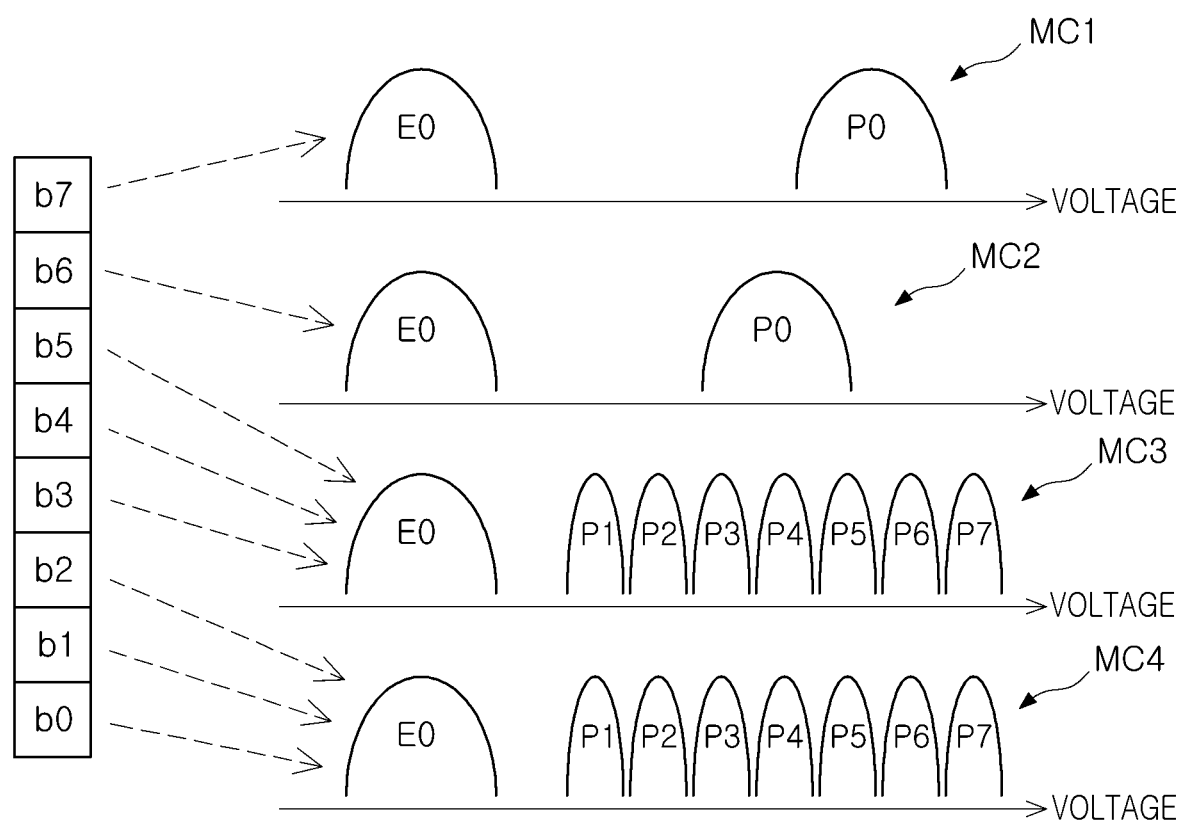

In the example embodiments illustrated in FIGS. 16 and 17, 8-bit data b7-b0 may be distributively stored in the four memory cells MC1-MC4. First, referring to FIG. 16, data of the most significant bit b7 may be stored in the first memory cell MC1 programmed in an SLC method. The data b6-b3 of the next 4 bits of the most significant bit may be distributively stored in the second and third memory cells MC2 and MC3 programmed by the MLC method, by respectively 2-bits. In addition, the lower 3 bits of data b2-b0 may be stored in the fourth memory cell MC4 programmed by the TLC method. Accordingly, the first memory cell MC1 in which the most significant bit of data b7 is stored may be programmed to have a widest sensing margin.

Next, referring to FIG. 17, the most significant 2 bits of data b7 and b6 may be stored in the first and second memory cells MC1 and MC2 programmed in an SLC method. The lower 6 bits of data b5-b0 may be distributively stored in the third and fourth memory cells MC3 and MC4 programmed in a TLC method, by respectively 3 bits. The first memory cell MC1 and the second memory cell MC2 in which the most significant 2 bits of data b7 and b6 are stored by one bit may be programmed to have different sensing margins. For example, the first memory cell MC1 may have a wider sensing margin than that of the second memory cell MC2. In other embodiments, however, the first memory cell MC1 and second memory cell MC2 may have substantially the same sensing margin.

Summarizing the programming operation of the memory device according to the example embodiments described with reference to FIGS. 14 to 17, it may be expressed as Table 1 below.

TABLE 1

| Bit | b7 | b6 | b5 | b4 | b3 | b2 | b1 | b0 |
|---|---|---|---|---|---|---|---|---|
| FIG. 14 | MC1 | MC2 | MC3 | MC4 | MC4 | MC5 | MC5 | MC5 |
| FIG. 15 | MC1 | MC2 | MC3 | MC3 | MC4 | MC4 | MC5 | MC5 |
| FIG. 16 | MC1 | MC2 | MC2 | MC3 | MC3 | MC4 | MC4 | MC4 |
| FIG. 17 | MC1 | MC2 | MC3 | MC3 | MC3 | MC4 | MC4 | MC4 |

However, the example embodiments described with reference to FIGS. 14 to 17 and Table 1 above are merely examples, and example embodiments of the present inventive concept are not limited thereto. For example, 8-bit data b7-b0 may be distributively stored in two memory cells programmed in the SLC method, in one memory cell programmed in the MLC method, and in one memory cell programmed in the QLC method. Alternatively, the 8-bit data b7-b0 may be distributively stored in one memory cell programmed in the SLC method, one memory cell programmed in the TLC method, and one memory cell programmed in the QLC method.

Also, the total number of bits that may be stored in M memory cells may be greater than N. For example, 6-bit data may be distributively stored in two memory cells programmed in the MLC method and one memory cell programmed in the QLC method. In this case, data may not be stored in the lower 2 bits of one memory cell programmed by the QLC method. For example, among the 4 bits of data read from one memory cell programmed by the QLC method, the lower 2 bits of data may not be used to generate 6 bits of data and may be ignored.

Figure 18:
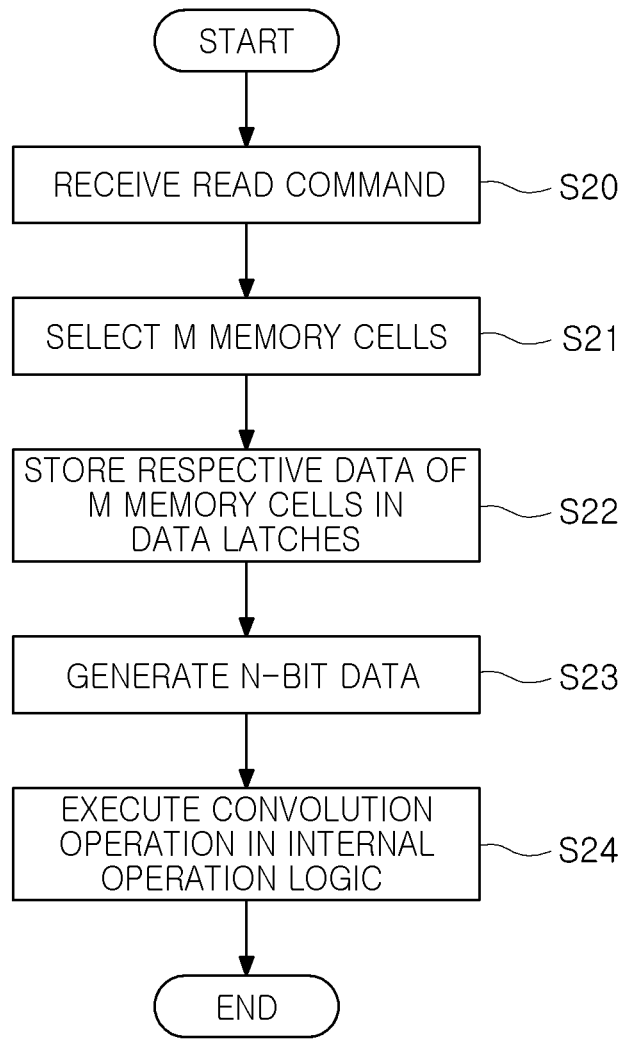
FIG. 18 is a flowchart illustrating the operation of a memory device according to an example embodiment.

FIG. 18 is a flowchart illustrating operations of a memory device according to an example embodiment.

Referring to FIG. 18, an operation of a memory device according to an example embodiment may be started by receiving a read command by a memory device (S20). For example, the memory controller of the memory device may read data stored in the memory cells in response to a read command received in operation S20. For example, the data may be weight data used for operation logic loaded in the memory controller to execute neural network calculations such as convolution calculations. The operation logic may execute convolution operations or the like using weight data, and may output result data. Therefore, instead of simply outputting data stored in the memory device by a read command, data resulting from an operation executed by operation logic in the memory device may be output.

In response to the read command, the memory controller may select M memory cells (S21). The M memory cells may be memory cells in which weight data used for calculation of operation logic is distributively stored by bit digits, and in an example embodiment, the M memory cells may share one channel region. For example, at least portions of the M memory cells may have different sensing margins. For example, at least portions of the M memory cells may be programmed using different methods.

The memory controller may store data read from the respective M memory cells in data latches of the page buffer (S22), and may generate N-bit data using the data stored in the data latches (S23). The N-bit data generated in operation S23 may be weight data used for calculation of the operation logic. The operation logic may execute convolution operations or the like using N-bit data (S24). However, the operation executed by the operation logic is not limited to a convolution operation, and may be variously modified according to example embodiments.

FIGS. 19 to 22 are diagrams illustrating reading operations of a memory device according to example embodiments.

In the example embodiments illustrated in FIGS. 19 to 22, there are cases in which 8-bit data b7-b0 is distributively stored in a plurality of memory cells for convenience of descriptions. The operation logic included in the memory controller may execute a predetermined calculation using 8-bit data b7-b0.

Figure 19:
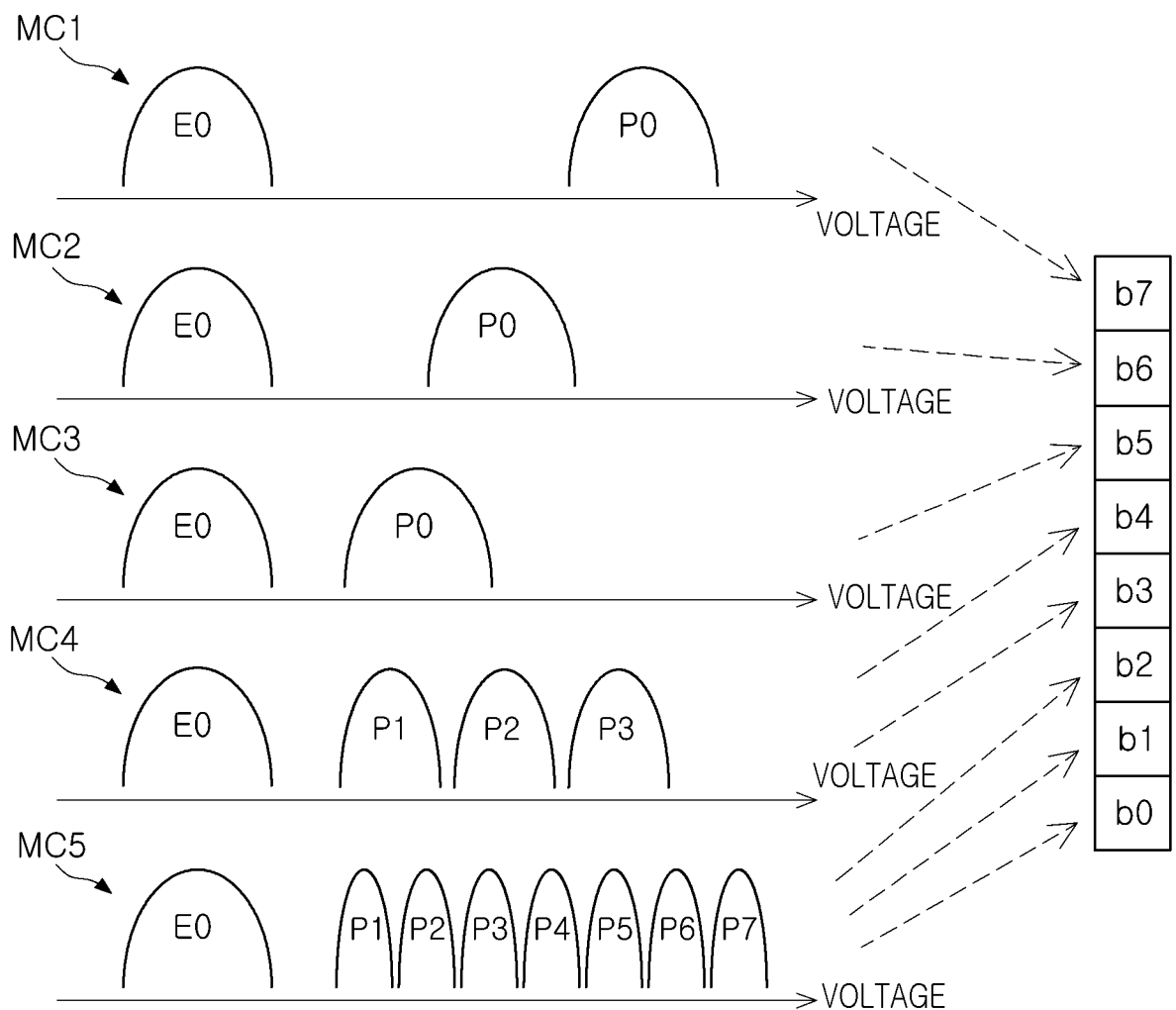
FIGS. 19 to 22 are diagrams illustrating a reading operation of a memory device according to example embodiments.
Figure 20:
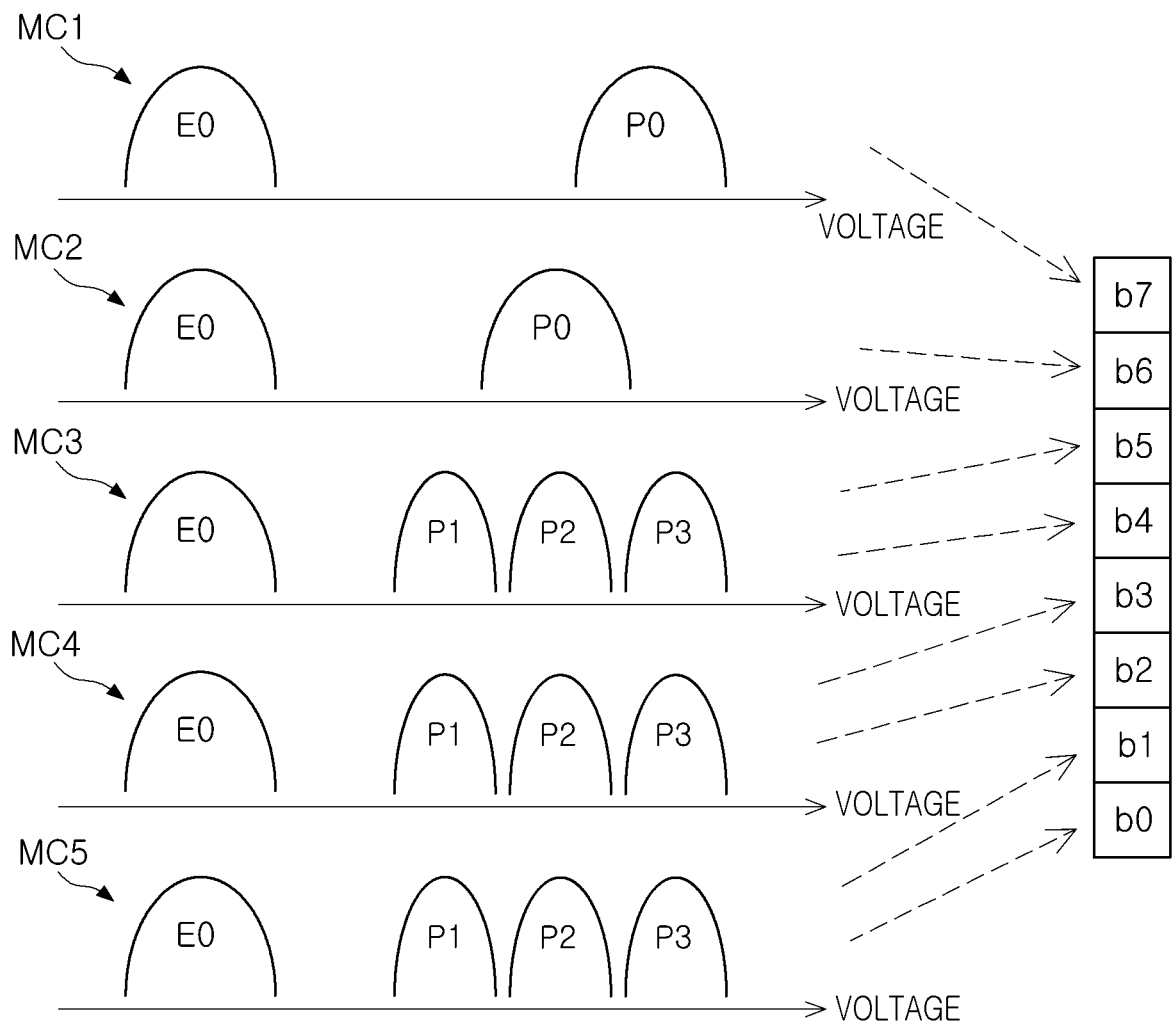

In the example embodiments illustrated in FIGS. 19 and 20, 8-bit data b7-b0 may be distributively stored in five memory cells MC1-MC5. In order for the operation logic to execute the calculation, the memory controller may read data stored in five memory cells MC1-MC5 and may generate 8-bit data b7-b0. Referring first to FIG. 19, data read from the first to third memory cells MC1-MC3 programmed in the SLC method, the fourth memory cell MC4 programmed in the MLC method, and the fifth memory cell MC5 programmed in the TLC method, may be combined to generate 8-bit data b7-b0. Referring to FIG. 20, data read from the first to third memory cells MC1-MC3 programmed in the SLC method and the fourth and fifth memory cells MC4 and MC5 programmed in the MLC method may be combined to generate 8 Bit data b7-b0. To do so, the memory controller may be configured to read from the first to third memory cells MC1-MC3 using an SLC method, to read from the fourth memory cell MC4 using the MLC method, and to read from the fifth memory cell MC5 using the TLC method in FIG. 19; and to read from the first and second memory cells MC1 and MC2 using an SLC method, and to read from the third through fifth memory cells MC3-MC5 using the MLC method in FIG. 20.

In the example embodiments illustrated in FIGS. 19 and 20, relatively higher upper bits among the 8-bit data b7-b0 may be stored in a memory cell programmed to have a wider sensing margin. When the operation logic executes an operation using 8-bit data b7-b0, the upper bit data may have a greater influence on the operation result. In detail, if an error is present in the data of the upper bit, the operation result may be changed greatly.

In example embodiments, the higher the bit data is, the bit data may be stored in the memory cell having the wider sensing margin. Accordingly, it may be estimated that reliability of a certain level or higher is secured in the data of the upper bit, and an error detection and correction process may be omitted in a reading operation of reading the 8-bit data b7-b0. As a result, the processing speed may be increased by improving the efficiency of the reading operation of reading 8-bit data b7-b0 in order for the operation logic to execute the calculation.

Figure 21:
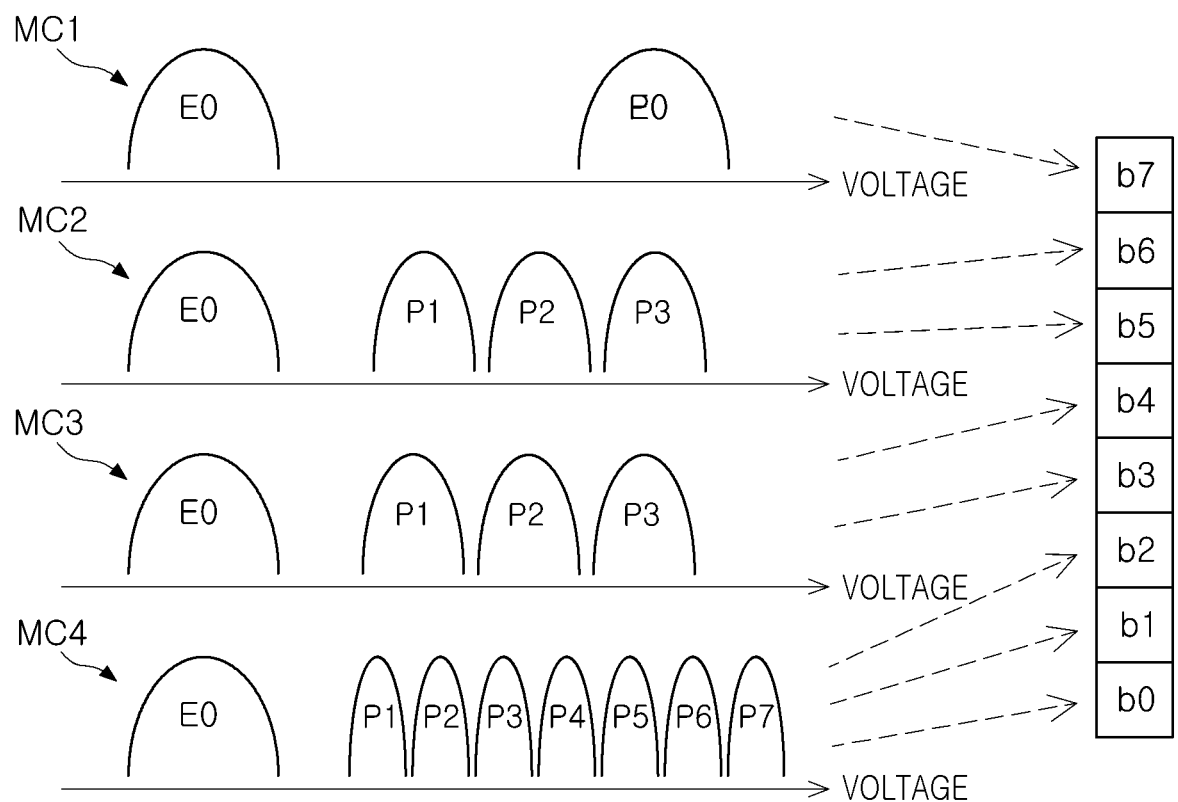
Figure 22:
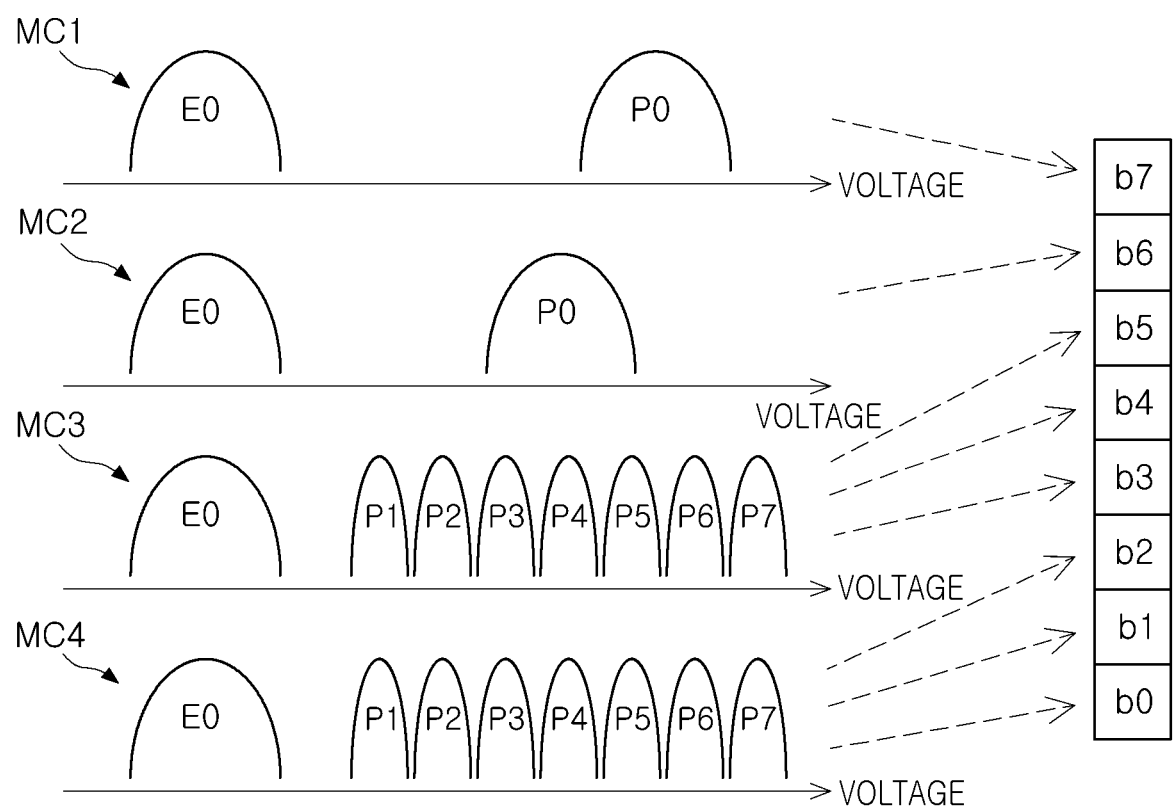

In the example embodiments illustrated in FIGS. 21 and 22, 8-bit data b7-b0 may be distributively stored in four memory cells MC1-MC4. The memory controller may read data stored in four memory cells MC1-MC4 and generate 8-bit data b7-b0. Referring first to FIG. 21, data read from the first memory cell MC1 programmed in the SLC method, the second and third memory cells MC2 and MC3 programmed in the MLC method, and the fourth memory cell MC4 programmed in the TLC method, may be combined to generate 8-bit data b7-b0. Referring to FIG. 22, the data read from the first and second memory cells MC1 and MC2 programmed in the SLC method and the third and fourth memory cells MC3 and MC4 programmed in the TLC method may be combined to generate 8 Bit data b7-b0.

In the example embodiments illustrated in FIGS. 21 and 22, the upper bits of the 8-bit data b7-b0 may be stored in a memory cell programmed to have a relatively wider sensing margin. In detail, in example embodiments, the higher the bit is (e.g., the closer the bit is to the MSB), the bit data may be stored in a memory cell programmed with a wider sensing margin. Accordingly, it may be estimated that reliability of a certain level or higher is secured in the data of the upper bit, and an error detection and correction process may be omitted in a reading operation of reading the 8-bit data b7-b0. As a result, the processing speed may be increased by improving the efficiency of the reading operation of reading 8-bit data b7-b0 in order for the operation logic to execute the calculation. In example embodiments, approximate computing, in which an operation is executed without correction even if an error exists in data of a lower bit, may be implemented in a memory device.

The reading operation described with reference to FIGS. 19 to 22 may be executed by a page buffer included in the memory controller. The page buffer may include a plurality of data latches storing data read from M memory cells in which N bits of data are distributively stored. To increase the accuracy of the reading operation on the data of the upper bit among the N-bit data, the reading operation on the memory cell in which the data of the upper bit is stored may be executed differently from the reading operation on the memory cell in which the data of the lower bit is stored. Also, the data latch storing the upper bit data and the data latch storing the lower bit data may have different characteristics.

On the other hand, in the reading operation described with reference to FIGS. 19 to 22, reading voltages input to memory cells in which 8-bit data b7-b0 are distributively stored may be variously selected. For example, in the example embodiment illustrated in FIG. 19, input voltages of the same magnitude or different magnitudes may be input to the first memory cell MC1, the second memory cell MC2, and the third memory cell MC3. In addition, input voltages of different magnitudes may be input to the first memory cell MC1, the fourth memory cell MC4, and the fifth memory cell MC5; which may be because the first memory cell MC1, the fourth memory cell MC4, and the fifth memory cell MC5 store data of different bit numbers.

Figure 23:
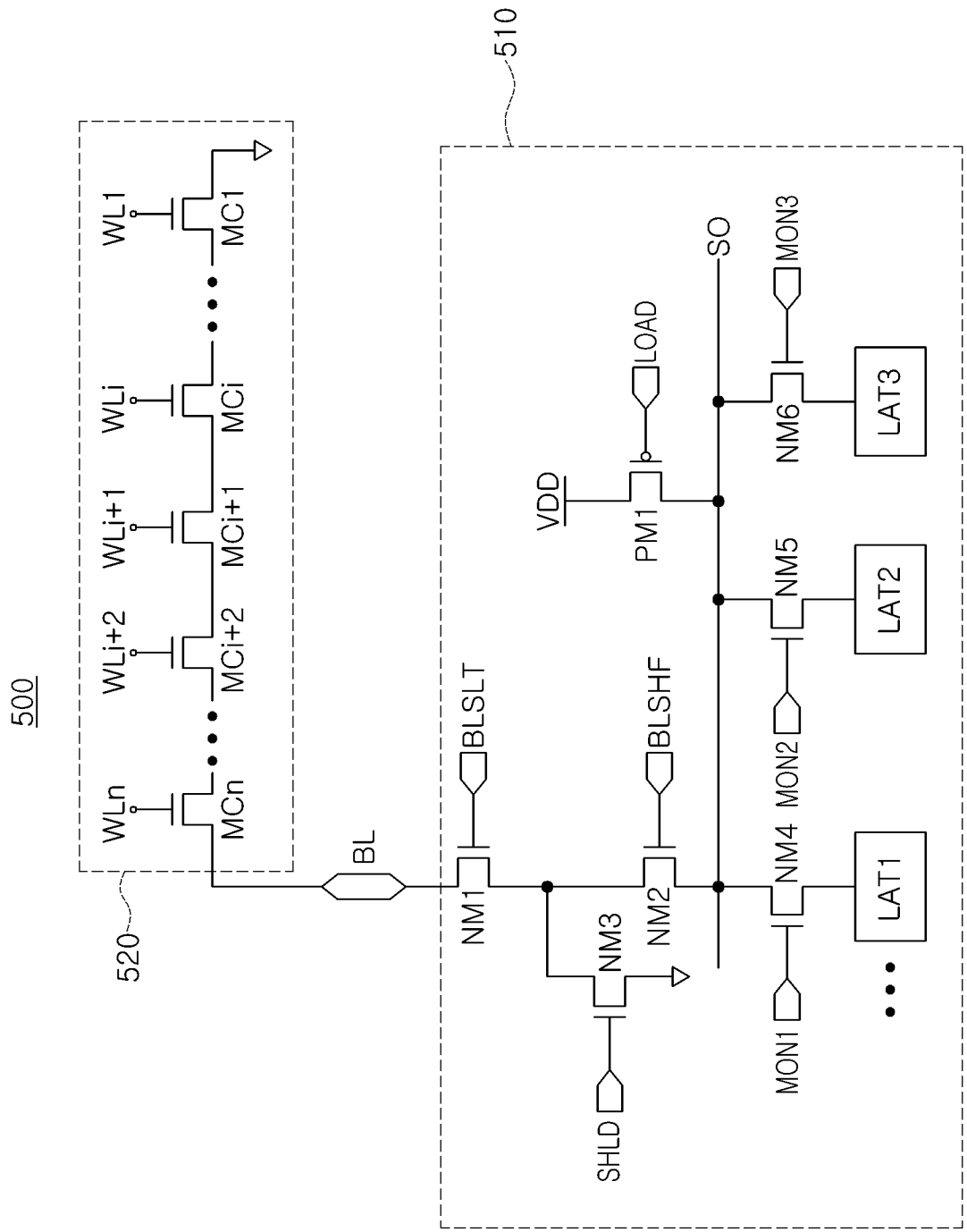
FIG. 23 is a schematic diagram illustrating a memory device according to an example embodiment.

FIG. 23 is a diagram briefly illustrating a memory device according to an example embodiment.

Referring to FIG. 23, a memory device 500 may include a page buffer 510 and a memory cell string 520. The page buffer 510 and the memory cell string 520 may be connected to each other through a bit line BL.

The page buffer 510 may include data latches LAT1-LAT3, a sensing node SO to which the data latches LAT1-LAT3 are connected, and switching element NM1-NM3 (also described as a switch, or switching circuit) determining the connection between the sensing node SO and the bit line BL, a pre-charge element PM1 (also described as a pre-charge circuit) pre-charging the sensing node SO and the bit line BL, and the like. The data latches LAT1-LAT3 are connected to the sensing node SO by the switching elements NM4-NM6, and the switching elements NM4-NM6 may be controlled by latch selection signals MON1-MON3.

The memory cell string 520 includes memory cells MC1-MCn connected in series with each other, and the memory cells MC1-MCn may be connected to word lines WL1-WLn. In some embodiments, in some of the memory cells (e.g., from WLi to WLi+2, weight data used for the operation logic mounted in the memory controller of the memory device 500 to execute a predetermined operation may be distributively stored.

When the reading operation starts, the pre-charge element PM1 is turned on, and the sensing node SO and the bit line BL may be pre-charged by power supply voltage VDD. To precharge the bit line BL, first and second switching elements NM1 and NM2 may be turned on by a control signal BLSSHF and a bit line selection signal BLSHT.

When the precharge operation is completed, the pre-charge element PM1 is turned off by a load signal LOAD, and word line control voltages may be input to the word lines WL1-WLn. For example, a reading voltage may be input to a word line connected to a selected memory cell to read data, and a pass voltage may be input to a word line connected to non-selected memory cells. As described above, while the word line control voltages are input to the word lines WL1-WLn, the development operation for the sensing node SO may be executed.

When the threshold voltage of the selected memory cell is less than the reading voltage, the selected memory cell is turned on by the reading voltage, and the voltage of the sensing node SO is rapidly and greatly reduced by the current flowing through the sensing node SO during the development operation. On the other hand, when the threshold voltage of the selected memory cell is greater than the reading voltage, the selected memory cell is not turned on, and current hardly flows to the sensing node SO during the development operation, and the voltage of the sensing node SO may be slowly and slightly reduced.

The operation logic mounted in the memory device 500 may execute a predetermined calculation using weighted data distributively stored in a plurality of memory cells MCi to MCi+2. For example, the weight data may be divided based on the number of bit digits and stored in the memory cells MCi to MCi+2. For example, when the weight data is 3-bit data, the data of the most significant bit is stored in the first memory cell MCi, the data of the middle bit is stored in the second memory cell MCi+1, and the data of the least significant bit is stored in the third memory cell MCi+2. In detail, when the weight data is N-bit (N is a natural number greater than 3) data, data of at least one upper bit including the most significant bit may be stored in the first memory cell MCi, and data of the middle bit may be stored in the second memory cell MCi+1, and data of at least one lower bit including the least significant bit may be stored in the third memory cell MCi+2.

Before the operation logic executes the operation, a reading operation of reading the weight data is executed, and the read data may be distributively stored in the data latches LAT1-LAT3. For example, the data of the most significant bit read from the first memory cell MCi is stored in the first data latch LAT1, and the data of the middle bit read from the second memory cell MCi+1 is stored in the second data latch, and the data of the least significant bit read from the third memory cell MCi+2 may be stored in the third data latch LAT3. The memory controller may generate weighted data by combining data stored in the data latches LAT1-LAT3 and may transfer the generated weight data to the operation logic.

In an example, the data latches LAT1-LAT3 may have trip voltages substantially equal to each other. When the data latches LAT1-LAT3 have the same trip voltage, the development operation may be changed depending on the data latches LAT1-LAT3 connected to the sensing node SO. For example, when the first data latch LAT1 storing the upper bit data is connected to the sensing node SO, the development operation may proceed relatively long. On the other hand, when the third data latch LAT3 storing the lower bit data is connected to the sensing node SO, the development operation may be relatively short. Therefore, the accuracy of the reading operation of reading the data of the upper bit may be increased.

On the other hand, in an example embodiment, at least portions of the data latches LAT1-LAT3 may have different trip voltages, and thus, at least portions of the data latches LAT1-LAT3 may have different areas. For example, the data of the most significant bit read from the first memory cell MCi may be stored in the first data latch LAT1 having a lowest trip voltage, and the data of the least significant bit read from the third memory cell MCi+2 may be stored in the third data latch LAT3 having a highest trip voltage.

The weight data bits stored in the memory cells may be described as including a plurality of sets of bits, or bit sets, for each bit string representing a weight data value. For example, for a 3-bit weight data, the weight data may be separated into three sets of bits, each set including one bit, stored to and read from three memory cells. For J-bit weight data (e.g., 8-bit weight data), the weight data may be separated into K sets of bits, each set including at least one bit, stored to and read from K memory cells. One set (e.g., an uppermost-bit set) includes the more important data, which may include at least the MSB of the J-bit weight data. One set (e.g., a lowermost-bit set) includes the less important data, which may include at least the LSB of the J-bit weight data. One or more sets (e.g., intermediate sets) include bit sets for bits between the uppermost-bit set and lowermost-bit set.

Figure 24:
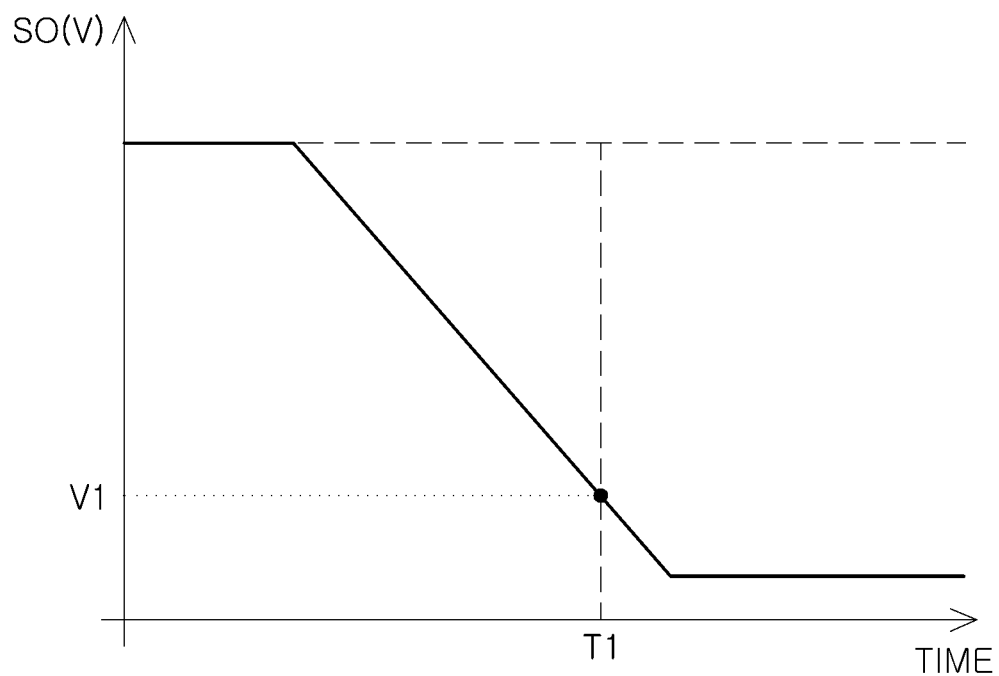
FIGS. 24 to 26 are drawings illustrating a reading operation of a memory device according to an example embodiment.
Figure 25:
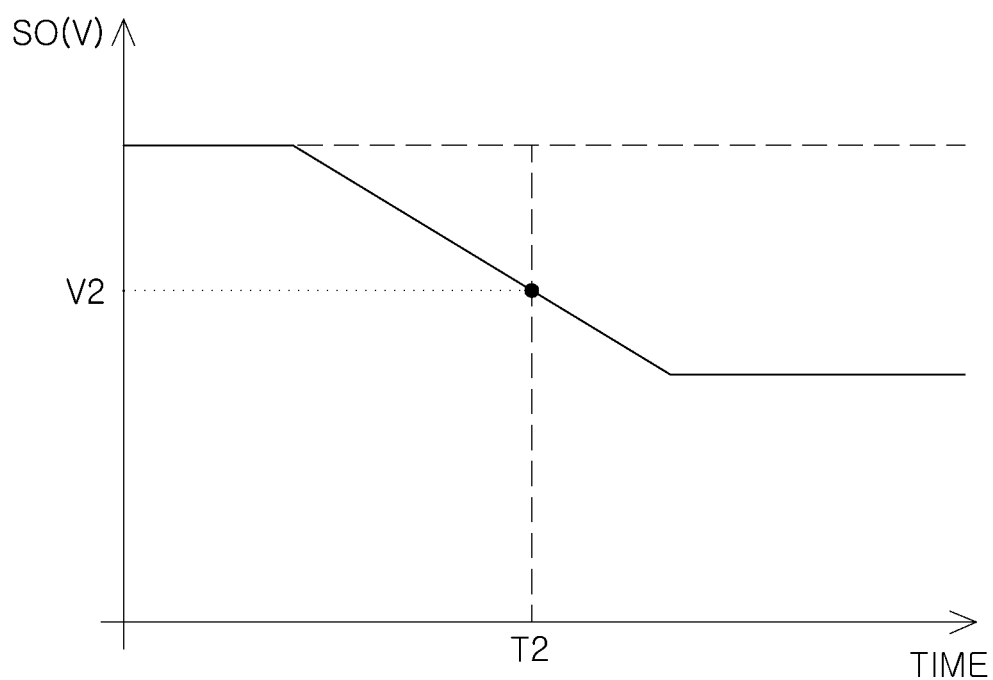
Figure 26:
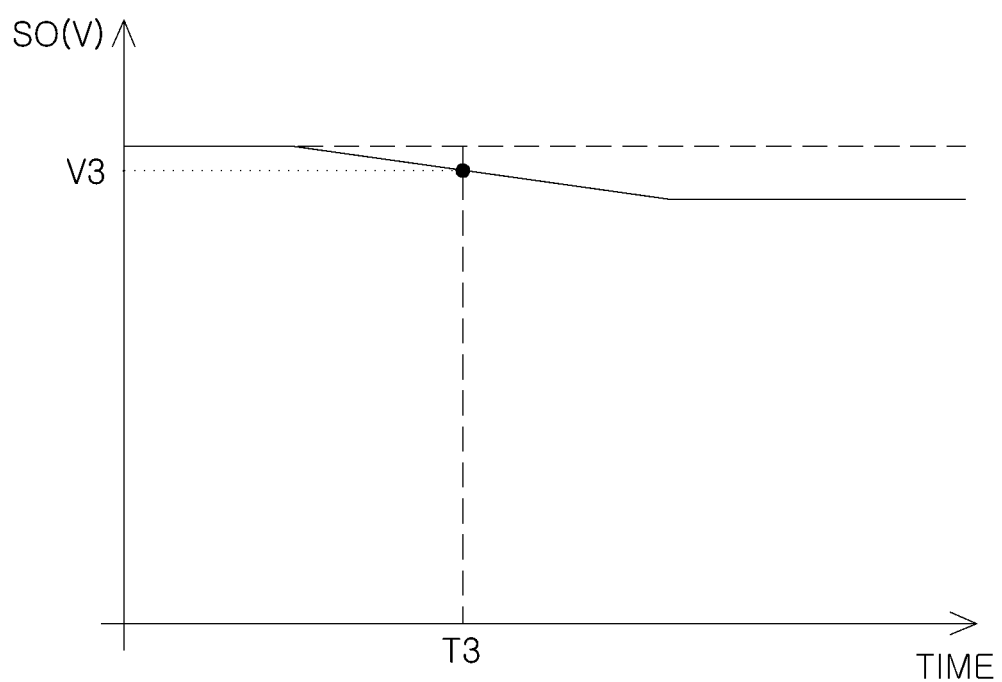

FIGS. 24 to 26 are drawings illustrating a reading operation of a memory device according to an example embodiment. Hereinafter, for convenience of description, it will be described with reference to FIG. 23 together.

FIGS. 24 to 26 are diagrams illustrating voltage changes of the sensing node SO in a reading operation when each of the memory cells MCi to MCi+2 has a programming state. In the example embodiments described below, the data latches LAT1-LAT3 included in the page buffer 510 may have different trip voltages. For example, the first data latch LAT1 may have a lowest trip voltage, and the third data latch LAT3 may have a highest trip voltage.

Referring first to FIG. 24, after a pre-charge operation for the sensing node SO and the bit line BL, a reading voltage may be input to the first memory cell MCi and a development operation for the sensing node SO may be executed. Since the first memory cell MCi has the widest sensing margin among the memory cells MCi to MCi+2, when the first memory cell MCi is turned on by the reading voltage, the voltage of the sensing node SO may be reduced by the current flowing through the sensing node SO, as illustrated in FIG. 24.

Considering that the sensing margin of the first memory cell MCi is significantly wide, data read from the first memory cell MCi may be stored in the first data latch LAT1 having a lowest first trip voltage V1. The first data latch LAT1 is connected to the sensing node SO after a first time T1 in a reading operation on the first memory cell MCi, to store data of the first memory cell MCi.

Referring to FIG. 25, after a precharge operation, a reading voltage may be input to the second memory cell MCi+1 and a development operation for the sensing node SO may be executed. The second memory cell MCi+1 may have a sensing margin narrower than that of the first memory cell MCi or may store more bits of data than the first memory cell MCi. Therefore, the reading voltage input to the second memory cell MCi+1 may be different from the reading voltage input to the first memory cell MCi. When the second memory cell MCi +1 is turned on by the reading voltage, the voltage of the sensing node SO may decrease by the current flowing through the sensing node SO as illustrated in FIG. 25. Data read from the second memory cell MCi+1 may be stored in the second data latch LAT2 having the second trip voltage V2 greater than the first trip voltage V1. The second data latch LAT2 is connected to the sensing node SO after a second time T2 earlier than the first time T1, to store data of the second memory cell MCi+1.

Referring to FIG. 26, a reading voltage may be input to the third memory cell MCi+2 and a development operation for the sensing node SO maybe executed. The third memory cell MCi+2 may have a sensing margin narrower than that of the first memory cell MCi or may store more bits of data than the first memory cell MCi. Therefore, the reading voltage input to the third memory cell MCi+2 may be different from the reading voltage input to the first memory cell MCi. When the third memory cell MCi+2 is turned on by the reading voltage, the voltage of the sensing node SO may decrease by the current flowing through the sensing node SO as illustrated in FIG. 26. Data read from the third memory cell MCi+2 may be stored in the third data latch LAT3 having a third trip voltage V3 greater than the second trip voltage V2. The third data latch LAT3 is connected to the sensing node SO after a third time T3 earlier than the second time T2, to store data of the third memory cell MCi+2.

In the example embodiments described with reference to FIGS. 24 to 26, the memory cells MCi to MCi+2 may be respectively programmed in an SLC method. When at least one of the memory cells MCi to MCi+2 is programmed in an MLC, TLC, or QLC method, a reading operation of reading data of 2 bits or more from the corresponding memory cell may be executed.

On the other hand, unlike the example embodiments described with reference to FIGS. 24 to 26, different reading operations may be applied to at least portions of the memory cells MCi to MCi+2. For example, a current sensing scheme having relatively high accuracy may be applied to the first memory cell MCi storing the upper bit data, and a voltage sensing scheme having a relatively fast read speed may be applied to the second and third memory cells MCi+1 and MCi+2 storing the middle bit and lower bit data.

Figure 27:
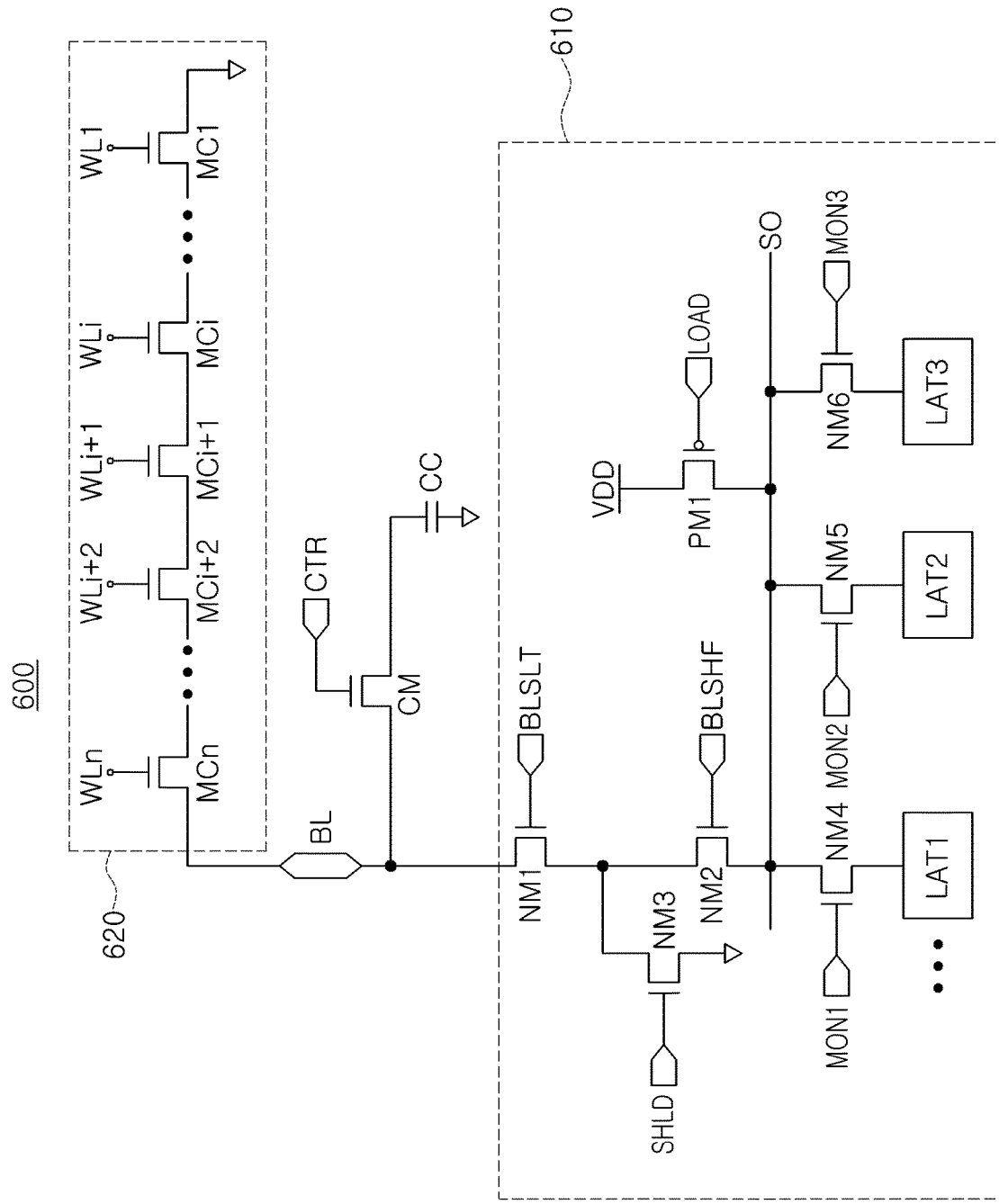
FIG. 27 is a schematic diagram illustrating a memory device according to an example embodiment.

FIG. 27 is a diagram briefly illustrating a memory device according to an example embodiment.

Referring to FIG. 27, a memory device 600 may include a page buffer 610 and a memory cell string 620. The page buffer 610 and the memory cell string 620 may be connected to each other through a bit line BL. The configuration and operation of the pager buffer 610 and the memory cell string 620 may be understood by referring to the description of the example embodiment illustrated in FIG. 23. In an example, the weight data required for the operation logic in the memory device 600 to execute the calculation is distributively stored in a plurality of memory cells MCi to MCi+2, and for example, the plurality of memory cells MCi to MCi+2 may be programmed to have different sensing margins.

In the example embodiment illustrated in FIG. 27, a charging switch CM and a charging capacitor CC may be connected between the bit line BL and the page buffer 610. The charging switch CM may be operated by a charging control signal CTR. The charging switch CM may be turned on when the pre-charge element PM1 is turned on by the load signal LOAD to execute pre-charging for the sensing node SO and the bit line BL. Therefore, the charging capacitor CC may be charged while the pre-charge is in progress.

In the development operation after the precharge operation, the charging capacitor CC may be connected to the sensing node SO to supply current to the bit line BL and the memory cell string 610. In an example embodiment, the charge amount of the charging capacitor CC is differently determined depending on the memory cells MCi to MCi+2 from which data is to be read, and thus, the amounts of current flowing to the respective memory cells MCi to MCi+2 in the development operation may be controlled differently.

For example, a time to charge the charging capacitor CC in a first reading operation of the first memory cell MCi programmed to have a widest sensing margin may be longer than a time to charge the charging capacitor CC in a second reading operation of the second memory cell MCi+1 programmed to have a relatively narrow sensing margin compared to the first memory cell MCi. In addition, the time for charging the charging capacitor CC in a third reading operation of the third memory cell MCi+2 programmed to have a narrowest sensing margin may be shorter than the time for charging the charging capacitor CC in the second reading operation.

Figure 28:
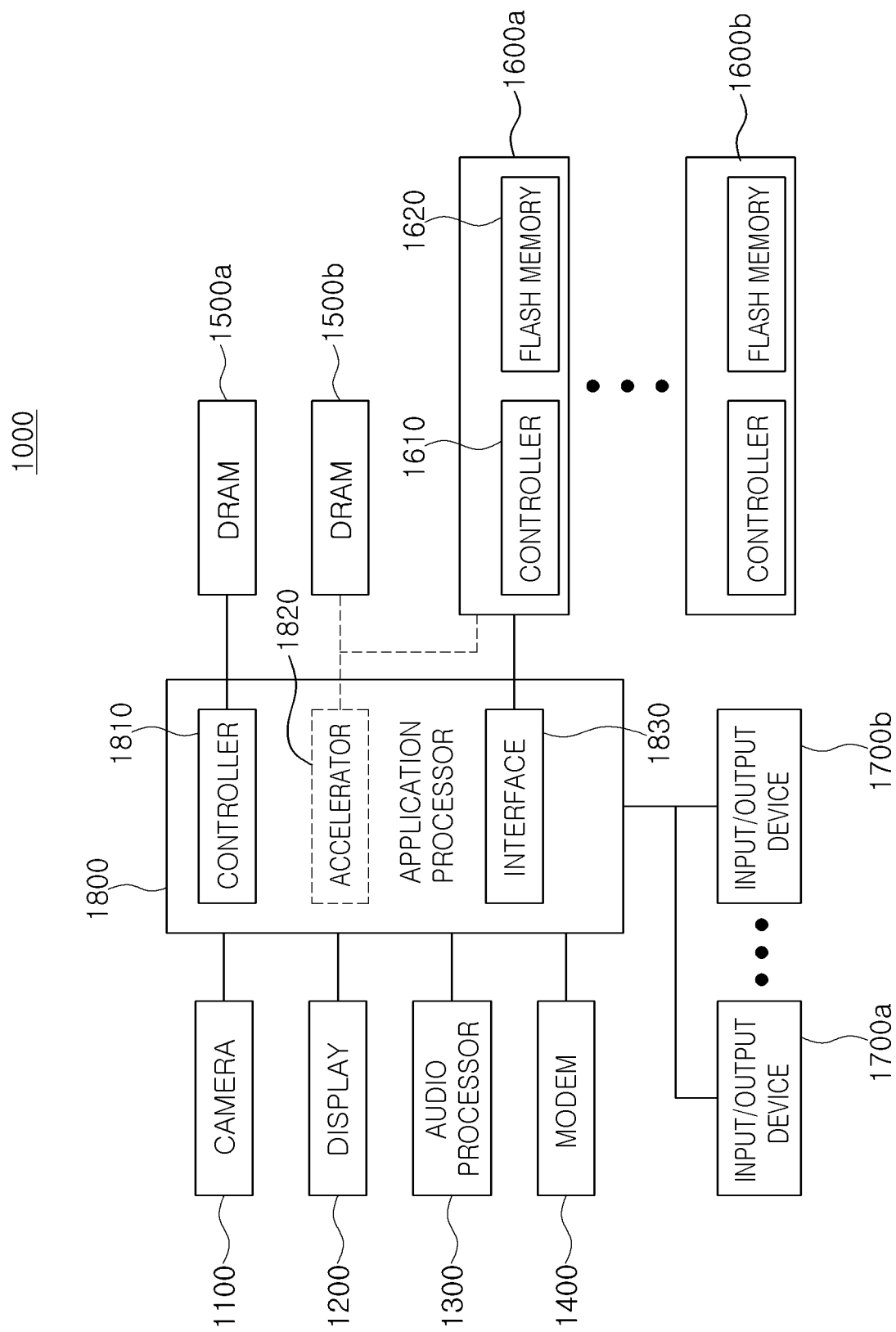
FIG. 28 is a schematic block diagram of a mobile system including a memory device according to an example embodiment.

FIG. 28 is a schematic block diagram of a mobile system including a memory device according to an example embodiment.

Referring to FIG. 28, a mobile system 1000 may include a camera 1100, a display 1200, an audio processor 1300, a modem 1400, dynamic random access memories (DRAMs) 1500a and 2500b, flash memory devices 1600a and 1600b, input/output devices 1700a and 1700b, and an application processor (hereinafter, referred to as "AP") 1800.

The mobile system 1000 may be implemented by a laptop computer, a portable terminal, a smart phone, a tablet PC, a wearable device, a healthcare device, or an Internet-of-Things (IoT) device. Also, the mobile system 1000 may be implemented by a server or a personal computer.

The camera 1100 may capture a still image or a video according to user control. The mobile system 1000 may acquire specific information by using a still image/video captured by the camera 1100 or may convert the still image/video into other types of data such as text and store the converted data. Alternatively, the mobile system 1000 may recognize a character string included in a still image/video photographed by the camera 1100 and provide a text or audio translation corresponding to the character string. As such, the field of use of the camera 1100 in the mobile system 1000 is increasingly diversified. In an example embodiment, the camera 1100 may transmit data such as a still image/video to the AP 1800 according to a D-Phy or C-Phy interface based on the MIPI standard.

The display 1200 may be implemented in various forms such as a liquid crystal display (LCD), an organic light emitting diodes (OLED) display, active-matrix organic light-emitting diode (AM-OLED), plasma display panel (PDP), field emission display (FED), or electronic paper. In an example embodiment, the display 1200 may also be used as an input device of the mobile system 1000 by providing a touch screen function. In addition, the display 1200 may be provided integrally with a fingerprint sensor or the like to provide a security function of the mobile system 1000. In an example embodiment, the AP 1800 may transmit image data to be displayed on the display 1200 according to a D-Phy or C-Phy interface based on the MIPI standard to the display 1200.

The audio processor 1300 may process audio data stored in the flash memory devices 1600a and 1600b or audio data included in contents received externally through the modem 1400 or the input/output devices 1700a and 1700b. For example, the audio processor 1300 may execute various processes such as coding/decoding, amplification, and noise filtering for audio data.

The modem 1400 modulates and transmits signals to transmit/receive wired/wireless data, while demodulating signals received from the outside to restore the original signal. The input/output devices 1700a and 1700b are devices that provide digital input and output, and may include a port that may be connected to an external recording medium, an input device such as touch screens or mechanical button keys, an output device capable of outputting vibrations in a haptic way, etc., and the like. In some examples, the input/output devices 1700a and 1700b may be connected to an external recording medium through ports such as USB, lightning cable, SD card, micro SD card, DVD, network adapter, or the like.

The AP 1800 may control the overall operation of the mobile system 1000. In detail, the AP 1800 may control the display 1200 such that a portion of the contents stored in the flash memory devices 1600a and 1600b is displayed on the screen. Also, when a user input is received through the input/output devices 1700a and 1700b, the AP 1800 may execute a control operation corresponding to the user input.

The AP 1800 may be provided as a system-on-chip (SoC) driving an application program, an operating system (OS), and the like. In addition, the AP 1800 may be included in other devices included in the mobile system 1000, for example, in the DRAM 1500a, a flash memory 1620, and/or a memory controller 1610 and in one semiconductor package. For example, in the form of a package such as Package on Package (PoP), Ball Grid Arrays (BGAs), Chip Scale Packages (CSPs), System In Package (SIP), Multi Chip Package (MCP), Wafer-level Fabricated Package (WFP), Wafer-Level Processed Stack Package (WSP) or the like, at least one device different from the AP 1800 may be provided. The kernel of the operating system running on the AP 1800 may include an input/output scheduler and device drivers for controlling the flash memory devices 1600a and 1600b. The device driver may control the access performance of the flash memory devices 1600a and 1600b by referring to the number of synchronous queues managed by the I/O scheduler, or may control the CPU mode inside the SoC, Dynamic Voltage and Frequency Scaling (DVFS) level, etc.

In an example embodiment, the AP 1800 may include a processor block that executes an operation or drives an application program and/or an operating system, and various other peripheral components connected through a processor block and a system bus. Peripheral components may include a memory controller, internal memory, power management block, error detection block, and monitoring block. The processor block may include one or more cores, and when a plurality of cores are included in the processor block, each of the cores includes a cache memory, and a common cache shared by the cores may be included in the processor block.

In an example embodiment, the AP 1800 may include an accelerator block 1820 that is a dedicated circuit for AI data computation. Alternatively, according to example embodiments, a separate accelerator chip may be provided separately from the AP 1800, and a DRAM 1500b may be additionally connected to the accelerator block 1820 or the accelerator chip. The accelerator block 1820 is a function block that professionally executes specific functions of the AP 1800, and includes a Graphics Processing Unit (GPU) that is a functional block that professionally executes graphic data processing, a Neural Processing Unit (NPU) which is a block for professionally executing AI calculation and inference (Inference), and a Data Processing Unit (DPU) that is a block that specializes in data transmission.

According to an example embodiment, the mobile system 1000 may include a plurality of DRAMs 1500a and 1500b. In an example embodiment, the AP 1800 may include a controller 1810 for controlling the DRAMs 1500a and 1500b, and the DRAM 1500a may be directly connected to the AP 1800.

The AP 1800 controls DRAM by setting commands and mode register sets (MRS) conforming to JEDEC standard specifications, or may communicate by establishing specifications and functions such as low voltage/high speed/reliability required by the mobile system 1000 and DRAM interface protocol for CRC/ECC. For example, the AP 1800 may communicate with the DRAM 1500a through an interface conforming to JEDEC standard standards such as LPDDR4 and LPDDR5. Alternatively, the AP 1800 may set a new DRAM interface protocol to control the DRAM 1500b for the accelerator in which the accelerator chip provided separately from the accelerator block 1820 or the AP 1800 has a higher bandwidth than the DRAM 1500a.

Although only DRAMs 1500a and 1500b are illustrated in FIG. 20, the configuration of the mobile system 1000 is not necessarily limited to this type. For example, depending on the bandwidth, response speed, and voltage conditions of the AP 1800 or the accelerator block 1820, other memories rather than the DRAMs 1500a and 2500b may also be included in the mobile system 1000. In an example, the controller 1810 and/or the accelerator block 1820 may control various memories such as PRAM, SRAM, MRAM, RRAM, FRAM, Hybrid RAM, and the like. The DRAMs 1500a and 2500b have relatively low latency and high bandwidth than the input/output devices 1700a and 1700b or the flash memory devices 1600a and 1600b. The DRAMs 1500a and 2500b may be initialized at the power-on time point of the mobile system 1000, and when the operating system and application data are loaded, the DRAMs 1500a and 2500b may be used as temporary storage locations for the operating system and application data or as execution spaces for various software codes.

In the DRAMs 1500a and 1500b, addition/subtraction/multiplication/dividing arithmetic operations and vector operations, address operations, or FFT operations data may be stored. In another embodiment, the DRAMs 1500a and 1500b may be provided as a processing-in-memory (PIM) equipped with a calculation function. For example, a function for executing a function used for inference in the DRAMs 1500a and 1500b may be executed. In this case, the inference may be executed in a deep learning algorithm using an artificial neural network. The deep learning algorithm may include a training operation of training a model through various data and an inference operation of recognizing data with the trained model. For example, the function used for the inference may include a hyperbolic tangent function, a sigmoid function, and a rectified linear unit (ReLU) function.

As an example embodiment, an image captured by the user through the camera 1100 may be signal-processed and stored in the DRAM 1500b, and the accelerator block 1820 or accelerator chip may execute AI data operation of recognizing data using data stored in the DRAM 1500b and the function used for inference.

According to an example embodiment, the mobile system 1000 may include a plurality of storage or a plurality of flash memory devices 1600a and 1600b having a larger capacity than the DRAMs 1500a and 1500b. The flash memory devices 1600a and 1600b may include the memory controller 1610 and the flash memory 1620. The memory controller 1610 receives control commands and data from the AP 1800, writes data to the flash memory 1620 in response to the control command, or reads data stored in the flash memory 1620 to access the AP 1800 and may transmit the data to the AP 1800.

According to an example embodiment, the accelerator block 1820 or the accelerator chip may execute training operations and AI data calculation using the flash memory devices 1600a and 1600b. In an example embodiment, operation logic capable of executing a predetermined operation inside the flash memory devices 1600a and 1600b may be implemented in the memory controller 1610, and the operation logic may execute at least a portion of the training operations and the operation of the inference AI data executed by the AP 1800 and/or the accelerator block 1820, in place, using the data stored in the flash memory 1620.

For example, the operation logic may execute AI data calculation, such as convolution calculation, and the data required for calculation of the operation logic may be stored in the flash memory 1620. For example, data used for the operation may be divided based on the number of bit digits, and may be stored in two or more memory cells connected to one bit line. The memory controller 1610 may execute a programming operation such that the first memory cell in which the data of the upper bit is stored has a wider sensing margin than the second memory cell in which the data of the lower bit is stored.

In order for the operation logic to execute calculation, the memory controller 1610 may read data stored in the first memory cell, the second memory cell, and the like, and may provide the data to the operation logic. For example, the memory controller 1610 may execute the first reading operation of the first memory cell and the second reading operation of the second memory cell in different ways. In an example embodiment, different magnitude currents may be used in the first reading operation and the second reading operation. Alternatively, data read by the first reading operation and data read by the second reading operation may be stored in data latches having different trip voltages.

In addition, the controller may omit error detection and correction processes in the first reading operation and the second reading operation, which may be because the data of the upper bit, which has a relatively large influence on the accuracy of the operation executed by the operation logic, is stored in the first memory cell programmed to have a relatively wide sensing margin. In detail, due to the wide sensing margin of the first memory cell, it may be estimated that there is no error in the data of the upper bit read from the first memory cell, thus the error detection and correction process may be omitted, thereby increasing the processing speed and implementing approximate computing.

In an example embodiment, the AP 1800 may include an interface 1830, and accordingly, the flash memory devices 1600a and 1600b may be directly connected to the AP 1800. For example, the AP 1800 may be implemented as an SoC, the flash memory device 1600a may be implemented as a separate chip from the AP 1800, and the AP 1800 and the flash memory device 1600a may be mounted in one package. However, the example embodiments are not limited thereto, and the plurality of flash memory devices 1600a and 2600b may be electrically connected to the mobile system 1000 through a connection.

The flash memory devices 1600a and 2600b may store data such as still images/movies taken by the camera 1100, or may store data received through a communication network and/or ports included in the input/output devices 1700a and 1700b, and for example, may store Augmented Reality/Virtual Reality, High Definition (HD), or Ultra High Definition (UHD) contents.

Figure 29:
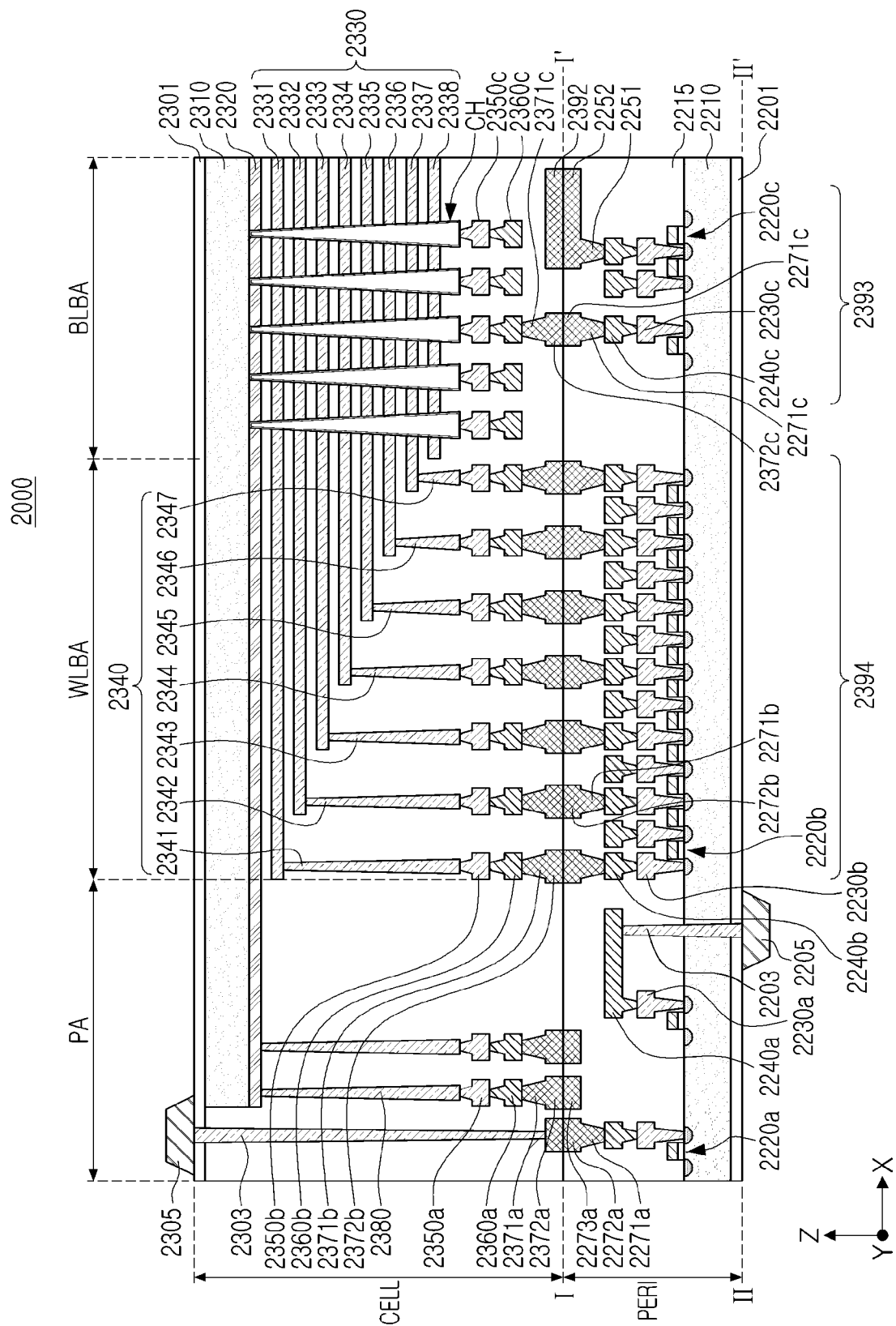
FIG. 29 is a view schematically illustrating a structure of a memory device according to an example embodiment.

FIG. 29 is a view schematically illustrating a structure of a memory device according to an example embodiment.

Referring to FIG. 29, a memory device 2000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals are formed of copper (Cu), the bonding manner may be a Cu—Cu bonding, and the bonding metals may also be formed of aluminum or tungsten.

Each of the peripheral circuit region PERI and the cell region CELL of the memory device 2000 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high resistance, and the second metal layers 2240a, 2240b, and 2240c may be formed of copper having relatively low resistivity.

In an example embodiment illustrate in FIG. 29, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like different from copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like.

The cell region CELL may include at least one memory block. The cell region CELL may include a second substrate 2310 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CH may extend in a direction, perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an example embodiment, the bit line 2360c may extend in a first direction (a Y-axis direction), parallel to the upper surface of the second substrate 2310.

In an example embodiment illustrated in FIG. 29, an area in which the channel structure CH, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (an X-axis direction), parallel to the upper surface of the second substrate 2310, and may be connected to a plurality of cell contact plugs 2341 to 2347 (i.e., 2340). The plurality of word lines 2330 and the plurality of cell contact plugs 2340 may be connected to each other in pads provided by at least a portion of the plurality of word lines 2330 extending in different lengths in the second direction. A first metal layer 2350b and a second metal layer 2360b may be connected to an upper portion of the plurality of cell contact plugs 2340 connected to the plurality of word lines 2330, sequentially. The plurality of cell contact plugs 2340 may be connected to the circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b providing a row decoder 2394 in the peripheral circuit region PERI. In an example embodiment, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input-output pads 2205 and 2305 may be disposed in the external pad bonding area PA. Referring to FIG. 29, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 29, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303.

According to embodiments, the second substrate 2310 and the common source line 320 may not be disposed in an area in which the second input-output contact plug 2303 is disposed. Also, the second input-output pad 2305 may not overlap the word lines 2330 in the third direction (the Z-axis direction). Referring to FIG. 29, the second input-output contact plug 2303 may be separated from the second substrate 2310 in a direction, parallel to the upper surface of the second substrate 2310, and may pass through the interlayer insulating layer 2315 of the cell region CELL to be connected to the second input-output pad 2305.

According to embodiments, the first input-output pad 2205 and the second input-output pad 2305 may be selectively formed. For example, the memory device 2000 may include only the first input-output pad 2205 disposed on the first substrate 2210 or the second input-output pad 2305 disposed on the second substrate 2310. Alternatively, the memory device 2000 may include both the first input-output pad 2205 and the second input-output pad 2305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu—Cu bonding.

Further, the bit line bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL.

A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

The memory device 2000, such as described in FIG. 29, can operate and include device components according to one or more of the example embodiments discussed previously.

As set forth above, according to example embodiments, data used for the calculation of operation logic may be divided depending on the number of bit digits and stored in two or more memory cells, and an upper bit included in the data may be stored in a memory cell having higher reliability than a lower bit. Therefore, an error detection process may be omitted from a reading operation of reading data used for the calculation, and the operation speed of the operation logic may be improved.

While example embodiments have been illustrated and described above, it will be apparent to those skilled in the art that modifications and variations could be made without departing from the scope of the present invention as defined by the appended claims.

What is claimed is:

1. A memory device comprising:
a memory cell array including M memory cells connected to one bit line and configured to distributively store N-bit data, where N is a natural number of 2 or more and M is a natural number of 2 or more and less than or equal to N, the M memory cells including a first memory cell and a second memory cell, having different sensing margins; and
a memory controller including a page buffer, the memory controller configured to distributively store the N-bit data in the M memory cells and to sequentially read data stored in the M memory cells to obtain the N-bit data, and including an operation logic configured to execute an operation using the N-bit data, the memory controller configured to provide different reading voltages to the first memory cell and the second memory cell.

2. The memory device of claim 1, wherein in the memory cell array, the M memory cells are consecutively disposed.

3. The memory device of claim 1, wherein a sensing margin of the first memory cell is greater than a sensing margin of the second memory cell.

4. The memory device of claim 3, wherein the number of bits of data stored in the first memory cell is less than or equal to the number of bits of data stored in the second memory cell.

5. The memory device of claim 3, wherein among the N-bit data, data stored in the first memory cell is uppermost bit data of a bit string compared to the data stored in the second memory cell.

6. The memory device of claim 3, wherein the number of bits of data stored in the first memory cell is equal to the number of bits of data stored in the second memory cell,
wherein a minimum value of a threshold voltage of a threshold voltage distribution for the first memory cell when programmed is greater than a maximum value of a threshold voltage of a threshold voltage distribution for the second memory cell when programmed.

7. The memory device of claim 1, wherein the page buffer comprises data latches for storing data obtained from the M memory cells, and at least some of the data latches have different trip voltages.

8. The memory device of claim 7, wherein a trip voltage of a first data latch for storing data obtained from the first memory cell is less than a trip voltage of a second data latch for storing data obtained from the second memory cell.

9. The memory device of claim 1, wherein the memory controller comprises a charging switch connected to the bit line, and a charging capacitor connected to the charging switch, and
wherein the memory controller is configured to cause a first amount of charges charged in the charging capacitor in a first reading operation of the first memory cell to be different from a second amount of charges charged in the charging capacitor in a second reading operation of the second memory cell.

10. The memory device of claim 9, wherein the memory controller is configured to set a time for charging the charging capacitor in the first reading operation to be longer than a time for charging the charging capacitor in the second reading operation.

11. The memory device of claim 1, configured such that when the page buffer obtains the N-bit data, the operation logic executes an operation using the N-bit data without an operation of correcting an error.

12. The memory device of claim 1, wherein the operation logic is configured to execute a convolution operation using the N-bit data.

13. A memory device comprising:
a memory cell array including a plurality of memory cells connected to a plurality of bit lines and a plurality of word lines; and
a memory controller configured to select M memory cells continuously connected to one bit line, among the plurality of memory cells, where M is a natural number of 2 or more, and to divide N-bit data into M sets of bits, and to store the M sets of bits in the M memory cells, respectively, where N is a natural number more than or equal to M,
wherein the M memory cells include a first memory cell for storing at least one upper bit of the N-bit data, and a second memory cell for storing at least one lower bit of the N-bit data, and
the memory controller is configured to program the first memory cell, which has a first sensing margin, and to program the second memory cell, which has a second sensing margin less than the first sensing margin.

14. The memory device of claim 13, wherein the memory controller is configured to store data of a most significant bit (MSB) of the N-bit data in the first memory cell, and to store data of a least significant bit (LSB) of the N-bit data in the second memory cell.

15. The memory device of claim 14, wherein the N-bit data comprise a sign bit and two or more information bits, and
the memory controller is configured to store at least one of a most significant bit of the information bits and the sign bit in the first memory cell.

16. The memory device of claim 13, wherein the memory controller is configured to perform a programming operation of storing the N-bit data, by inputting a first programming voltage to a first word line connected to the first memory cell, and inputting a second programming voltage less than the first programming voltage to a second word line connected to the second memory cell.

17. The memory device of claim 13, wherein the memory controller is configured to store the N-bit data in the M memory cells by an incremental step pulse program (ISPP) operation,
    wherein, in the ISPP operation, the number of times the programming voltage is input to a first word line connected to the first memory cell is greater than the number of times the programming voltage is input to a second word line connected to the second memory cell.

* * * * *